(12) United States Patent
Yoshikawa

(10) Patent No.: US 7,602,273 B2
(45) Date of Patent: Oct. 13, 2009

(54) SEMICONDUCTOR DEVICE, METHOD OF MANUFACTURING THE SAME, AND ELECTRONIC DEVICE

(75) Inventor: Rei Yoshikawa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 208 days.

(21) Appl. No.: 11/090,005

(22) Filed: Mar. 28, 2005

(65) Prior Publication Data
US 2005/0219034 A1    Oct. 6, 2005

(30) Foreign Application Priority Data
Mar. 29, 2004    (JP) .............................. 2004-096372

(51) Int. Cl.
*H01C 7/10*    (2006.01)
(52) U.S. Cl. .................... 338/22 SD; 330/256
(58) Field of Classification Search ............ 338/22 SD, 338/306, 308, 309, 322, 195, 22 S; 331/111, 331/143; 73/766; 327/253
See application file for complete search history.

(56) References Cited

U.S. PATENT DOCUMENTS

| | | | | |
|---|---|---|---|---|
| 4,174,639 A | * | 11/1979 | Raven | .......................... 73/766 |
| 4,746,896 A | * | 5/1988 | Mcquaid et al. | ......... 338/22 SD |
| 4,853,646 A | * | 8/1989 | Johnson et al. | ............. 330/256 |
| 5,889,441 A | * | 3/1999 | Inn | .............................. 331/143 |
| 5,990,720 A | * | 11/1999 | Tokioka et al. | ............... 327/253 |
| 2003/0122056 A1 | * | 7/2003 | Wada et al. | ............... 250/214.1 |

FOREIGN PATENT DOCUMENTS

| | | |
|---|---|---|
| JP | 5-75445 | 3/1993 |
| JP | 2002-246849 | 8/2002 |

* cited by examiner

*Primary Examiner*—Elvin G Enad
*Assistant Examiner*—Joselito Baisa
(74) *Attorney, Agent, or Firm*—Dickstein Shapiro LLP

(57) ABSTRACT

A semiconductor device is disclosed that includes a resistive element including a first resistor having a positive temperature coefficient and a second resistor having a negative temperature coefficient. The first resistor includes a metal film.

15 Claims, 13 Drawing Sheets

SEMICONDUCTOR DEVICE, METHOD OF MANUFACTURING THE SAME, AND ELECTRONIC DEVICE

BACKGROUND OF THE INVENTION

1. Field of the Invention

The present invention relates generally to semiconductor devices, methods of manufacturing the same, and electronic devices, and more particularly to a semiconductor device including a resistive element, a method of manufacturing the same, and an electronic device employing the same.

2. Description of the Related Art

Conventionally, resistors such as those using a Si impurity diffusion layer and those formed of polysilicon have been widely used for forming a resistive element incorporated into semiconductor devices and electronic devices. The resistance of such a resistive element is controlled by, for instance, previously providing multiple interconnection lines that short-circuit the resistors forming the resistive element, and cutting off one or more of the interconnection lines in accordance with the results of circuit measurement. In this case, in part of the resistive element where the interconnection lines are cut off, the resistors function so as to increase the resistance of the resistive element.

Such a method of controlling the resistance of the resistive element entails the following problems.

The first problem is that the accuracy of the resistance control is low so that the obtained resistance varies greatly. The second problem is that it is difficult to accurately control the rate of change in the resistance of the resistive element with respect to a change in temperature, that is, it is difficult to control the temperature coefficient of the resistive element with accuracy. The third problem is that the control of the resistance can be performed only in a direction to increase the resistance and it is difficult to correct the control once it has been performed because the resistance is controlled by cutting off interconnection lines.

The following methods have been proposed to solve the above-described problems.

For instance, in order to solve the problem that it is difficult to control the temperature coefficient of the resistive element, Japanese Laid-Open Patent Application No. 5-75445 discloses a device and method for correcting a variation in the oscillation frequency of a CPU in the case of the occurrence of a change in a condition such as temperature. FIG. 1 is a block diagram illustrating the conventional correction device.

Referring to FIG. 1, in the correction device, the positive electrode of a power supply 2 is connected to the terminal Vcc of a CPU 1, and the negative electrode of the power supply 2 is connected to the ground terminal (GND) of the CPU 1. Further, the positive electrode of the power supply 2 is connected via a switch 3 to a line 11, to which a voltage detector 4, a temperature detector 5, and an $E^2PROM$ 6 are connected.

Further, the negative electrode of the power supply 2 is connected to a line 12, to which the negative side of each of the voltage detector 4, the temperature detector 5, and the $E^2PROM$ 6 is connected.

A series circuit of a resistor 7 and a capacitor 9 and a series circuit of a resistor 8 and a capacitor 10 are connected to the lines 11 and 12, respectively, thereby forming the oscillation element of a CR oscillator.

According to the correction device illustrated in FIG. 1, the oscillation frequency of the CR oscillation element at the time of supply voltage and ambient temperature satisfying reference measurement conditions is stored in the $E^2PROM$ 6 as a reference oscillation frequency. The CPU 1 corrects the oscillation frequency based on the reference value in accordance with changes in temperature and voltage from the reference measurement conditions, the changes being measured by the temperature detector 5 and the voltage detector 4.

In this case, for instance, with respect to temporal control means realized by performing counting on a system clock signal, the CPU 1 corrects a count in accordance with changes in temperature and voltage.

In addition to the above-described correction device, for instance, Japanese Laid-Open Patent Application No. 2000-91890 discloses a CR oscillation circuit in which a frequency variation due to a change in temperature is controlled. FIG. 2 is a circuit diagram illustrating the conventional CR oscillation circuit.

Referring to FIG. 2, the CR oscillation circuit includes a comparator 21, a reference signal generator circuit 22, a capacitor 23, a resistor 24, and inverters 25 and 26. The capacitor 23 and the resistor 24 are connected in series between the output of the inverter 26 and ground so as to form a charging and discharging circuit.

The inverting input terminal of the comparator 21 is connected to a connection node N1 of the capacitor 23 and the resistor 24. A reference signal, which is the output of the reference signal generator circuit 22, is input to the non-inverting input terminal of the comparator 21.

A reference voltage generated by dividing voltage among resistors 27 through 29 connected in series between a power supply and ground in the reference voltage generator circuit 22 is applied to the comparator 21 via an FET 30 or 31.

In general, if the resistance of the resistor 24 changes because of temperature, there is concern that an output frequency may be subject to change. In the case of the illustrated oscillation circuit, a temperature coefficient employed for the resistor 28 is different in value from those employed for the resistor 27 or 29. Accordingly, it is possible to prevent such a change in the frequency.

That is, as a result of designing the reference voltage generator circuit 22 so that an upper limit voltage VH and a lower limit voltage VL in the case of the CR circuit performing charging and discharging are caused to change by temperature, the effect of a change in the resistance of the resistor 24 due to temperature exerted on the frequency is relaxed, so that a change in the output frequency due to a change in temperature is prevented.

Besides the above-described oscillation circuit, for instance, Japanese Laid-Open Patent Application No. 2002-246849 discloses an amplifier circuit that enables amplification degree to be changed in accordance with a change in temperature. FIG. 3 is a circuit diagram illustrating the conventional amplifier circuit.

Referring to FIG. 3, the amplifier circuit is employed with an input signal Vin being supplied between input terminals 38 and 39. The input terminal 38 is connected to the inverting input terminal of an operational amplifier 35 via resistors 42a and 42b connected in series. The input terminal 39 is connected to the non-inverting input terminal of the amplifier 35 via resistors 43a and 43b connected in series. The output terminal of the amplifier 35 is connected to an output terminal 37.

The inverting input terminal of the amplifier 35 is connected to the output terminal 37 via a resistor 40. The non-inverting input terminal of the amplifier 35 is connected via a resistor 41 to a terminal 36 to which a reference voltage Vref is applied.

In the amplifier circuit, the resistors 42a and 42b are formed to have different temperature coefficients. Accordingly, it is possible to set the temperature coefficient of amplification degree variably by changing the resistance ratio of the resistor 42a to the resistor 42b.

However, in the case of using the correction device illustrated in FIG. 1, there is a problem in that the configuration of the correction device is complicated so as to increase a circuit in scale.

In the oscillation circuit illustrated in FIG. 2 and the amplifier circuit illustrated in FIG. 3, it is proposed to use multiple resistors of different temperature coefficients in combination. In this case, however, it is difficult in particular to employ a resistor having a positive temperature coefficient for the following reasons, which causes a problem in that it is difficult to achieve a desired temperature coefficient.

For instance, in the case of using the conventionally used resistor using a Si impurity diffusion layer or formed of polysilicon, it is difficult to increase sheet resistance. Therefore, an attempt to obtain a desired resistance in a circuit to be formed increases the resistor size. This makes it difficult to use such a resistor in a normal-size circuit, and also causes a problem in that it is difficult to miniaturize the circuit.

Further, in the case of employing a resistive element using a resistor having a positive temperature coefficient and the conventionally used resistor having a negative temperature coefficient in combination, an attempt to control the temperature coefficient of the resistive element by combining the resistors may result in a problem because the resistors differ greatly in sheet resistance.

For instance, since the resistor having the positive temperature coefficient and the resistor having the negative temperature coefficient differ greatly in size in the circuit, there is a difference in processing accuracy between the resistors in the process of forming the resistors, such as an etching process, and the processing process is also complicated. Further, the resistor having the positive temperature coefficient and the resistor having the negative temperature coefficient differ greatly in the smallest unit of resistor size with which a desired resistance can be obtained, that is, in resistor resolution in the case of controlling the resistance and the temperature coefficient of each resistor. In some cases, this makes it difficult to control the resistance and the temperature coefficient of each resistor with accuracy.

Further, for instance, with a resistor using an N-type well layer, it is possible to form a resistor having a positive temperature coefficient and a high sheet resistance, but it is difficult to form a resistor having a small line width. As a result, the area occupied by the resistor increases, which, in some cases, makes it difficult to miniaturize a circuit using the resistor.

In addition to the above-described problems, there is concern over the following problems.

In the case of employing a resistive element using multiple resistors having different temperature coefficients in combination in the oscillation circuit illustrated in FIG. 2 and the amplifier circuit illustrated in FIG. 3, it is necessary to measure the characteristic related to a temperature coefficient and the resistance of each of the resistors of different types with accuracy. However, there is a problem in that a method and technique for such accurate measurement have not been established completely.

For instance, if a test terminal is provided directly to a resistor in the oscillation circuit in order to measure the temperature characteristic of the resistor, the circuit cannot be expected to operate with accuracy because of the parasitic capacitance of the terminal and noise. Accordingly, monitoring means for measuring the temperature characteristic of the resistor is required separately. However, it is difficult to equalize measurement conditions such as the sheet number and the bias voltage of the monitoring means with those in its operating state in which the monitoring means is incorporated into the actual circuit. Accordingly, the results of the control of the resistance and the temperature coefficient of the resistor are likely to include offsets. For instance, in the oscillation circuit illustrated in FIG. 2, the bias voltage applied to capacitance and resistance before the control is applied to the resistors is different from that after the control is applied to the resistors, so that there is also concern over the effect of the difference.

Further, there is another possible problem in the conventional resistor control method. For instance, it may be difficult to control a resistor in the oscillation circuit illustrated in FIG. 2 or the amplifier circuit illustrated in FIG. 3 only by previously providing multiple interconnection lines that short-circuit the resistors forming a resistive element, and cutting off one or more of the interconnection lines in accordance with the results of circuit measurement.

In this case, one or more of the interconnection lines that short-circuit the resistors are cut off in accordance with measurements obtained by initially measuring the resistance and the temperature coefficient of the resistive element. That is, control is performed only in the direction to increase the resistance in accordance with the measurements. Accordingly, it is difficult to determine the degree of change by changing the resistance in both increasing and decreasing directions at the stage of controlling the resistive element.

Therefore, the resistance of the resistive element is set to a low value in its initial state, and control is performed in a direction to increase the resistance. In the case of, for instance, the oscillation circuit illustrated in FIG. 2, this causes a problem in that if a frequency before the control is offset from a target frequency, the operational delays of the comparator 21 and the inverters 25 and 26 have effects different from those on the controlled frequency, so that an accurate frequency correction cannot be obtained.

Further, there is also a possibility in the amplifier circuit illustrated in FIG. 3 that if the resistance differs greatly between before and after controlling, a change is caused in the characteristic because of the effect of noise, so that a desired characteristic cannot be obtained.

That is, in these circuits, it is difficult to accurately measure the resistance and the temperature coefficient of a resistor in a state close to the actual form of usage, thus causing a problem in that it is difficult to obtain a desired characteristic by controlling the resistance and the temperature coefficient of the resistor with accuracy.

SUMMARY OF THE INVENTION

Accordingly, it is a general object of the present invention to provide a semiconductor device, a method of manufacturing the same, and an electronic device in which the above-described disadvantages are eliminated.

A more specific object of the present invention is to provide a semiconductor device that controls variations in the resistance and the temperature coefficient of a resistive element and improves operational characteristics by using a resistor having a positive temperature coefficient and high sheet resistance in the resistive element, and an electronic device using the semiconductor device.

Another more specific object of the present invention is to configure each of the semiconductor device and the electronic device with a simple structure.

Yet another more specific object of the present invention is to provide a method of manufacturing a semiconductor device having a resistive element, which method can control the resistance and the temperature coefficient of the resistive element with high accuracy.

One or more of the above objects of the present invention are achieved by a semiconductor device, including a resistive element including: a first resistor having a positive temperature coefficient; and a second resistor having a negative temperature coefficient, wherein the first resistor includes a metal film.

According to the above-described semiconductor device, a first resistor including a metal film is employed. This makes it possible to increase the sheet resistance of the first resistor having a positive temperature coefficient. As a result, it is possible to control variations in the resistance and the temperature coefficient of a resistive element, and to provide good operational characteristics to a semiconductor device using the resistive element.

One or more of the above objects of the present invention are achieved by an electronic device, including: a semiconductor device according to the present invention, the semiconductor device being employed as one of: part of a resistor of a CR oscillation circuit; a current control resistor of a constant current circuit; an output voltage detection resistor of a constant voltage circuit; and a detection resistor of a voltage detector circuit.

One or more of the above objects of the present invention are achieved by an electronic device, including an operational amplifier circuit including a semiconductor device according to the present invention.

One or more of the above objects of the present invention are achieved by an electronic device, including a filter circuit including a semiconductor device according to the present invention.

One or more of the above objects of the present invention are achieved by a method of manufacturing a semiconductor device including a resistive element, the resistive element including a plurality of first resistors each including a metal film and a plurality of second resistors having a temperature coefficient different from that of the first resistors, the method including the steps of: (a) measuring a resistance of the resistive element; and (b) changing, in accordance with the measured resistance, at least one of a number of resistors of the first resistors functioning in the resistive element and a number of resistors of the second resistors functioning in the resistive element.

According to the above-described method, it is possible to control the resistance and the temperature coefficient of a resistive element with high accuracy.

According to the present invention, a resistor having a positive temperature coefficient and high sheet resistance is employed for a resistive element of the semiconductor device. Accordingly, it is possible to control variations in the resistance and the temperature coefficient of the resistive element, and thus to provide a semiconductor device having good operational characteristics.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Next, a description is given, with reference to the accompanying drawings, of embodiments of the present invention.

First Embodiment

Figure 4:
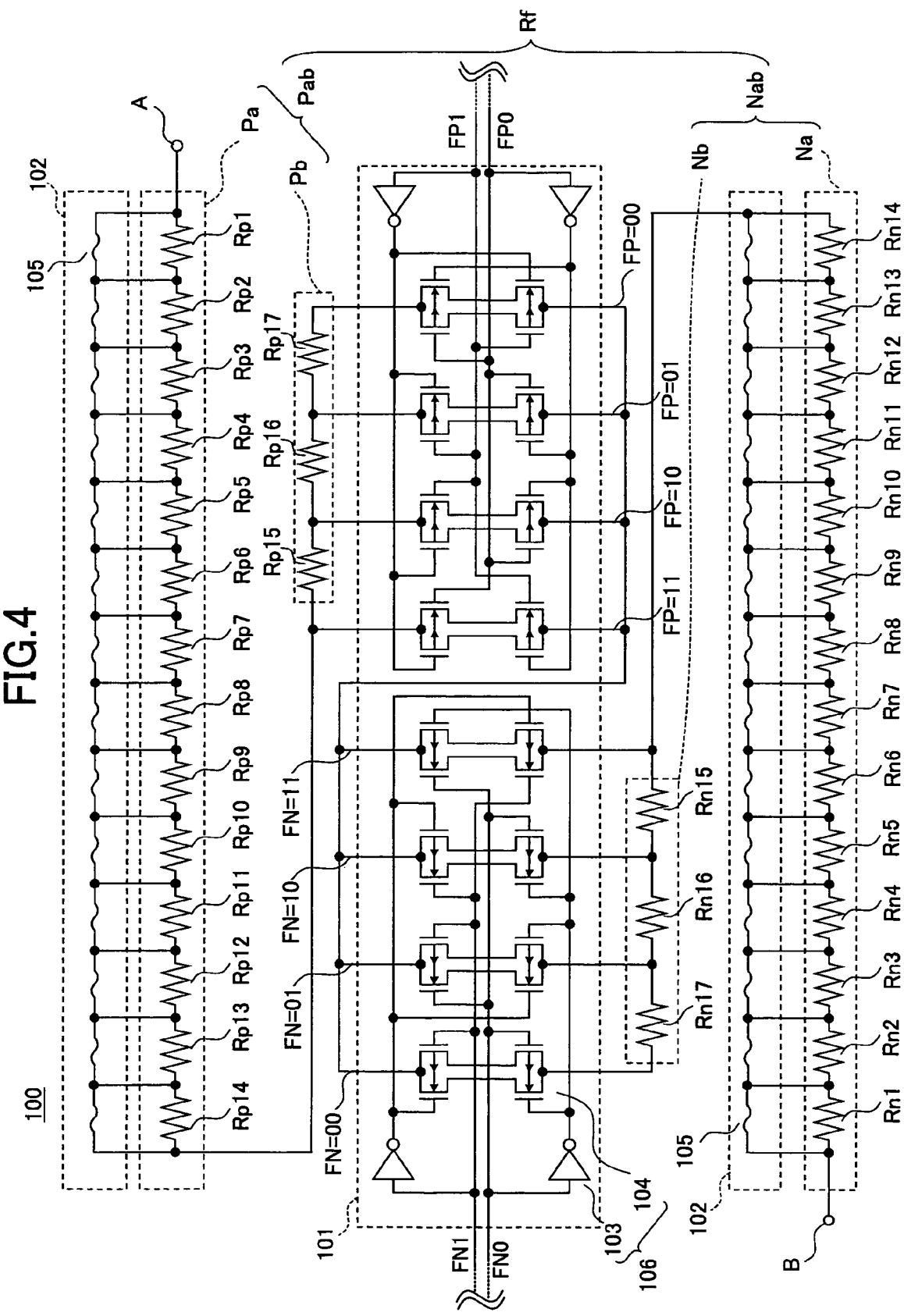
FIG. 4 is a schematic circuit diagram illustrating a semiconductor device according to a first embodiment of the present invention.

FIG. 4 is a schematic diagram illustrating a semiconductor device 100 including a resistive element according to a first embodiment of the present invention.

Referring to FIG. 4, the semiconductor device 100 includes a resistive element Rf formed between a terminal A and a terminal B. The resistive element Rf includes resistive elements having different temperature coefficients, that is, a resistive element Pab having a positive temperature coefficient and a resistive element Nab having a negative temperature coefficient. The resistive elements Pab and Nab are connected in series, for instance.

The resistive element Pab includes multiple resistors of a positive temperature coefficient connected in series. The resistive element Nab includes multiple resistors of a negative temperature coefficient connected in series. The semiconductor device 100 includes a connection change part that changes the state of connection of these resistors. It is possible to control the resistance and the rate of change in the resistance with respect to a change in temperature, that is, the temperature coefficient, of the resistive element Rf by the connection change part changing the numbers of resistors of different temperature coefficients connected in the resistive element RF, for instance, the number of resistors of the positive temperature coefficient functioning in the resistive element Rf and the number of resistors of the negative temperature coefficient functioning in the resistive element Rf.

The resistive element Pab includes a resistive element Pa and a resistive element Pb that are, for instance, connected in series. The resistive element Pa includes resistors Rp1 through Rp14 having the positive temperature coefficient and connected in series, for instance. The resistive element Pb includes resistors Rp15 through Rp17 having the positive temperature coefficient and connected in series, for instance.

Likewise, the resistive element Nab includes a resistive element Na and a resistive element Nb that are, for instance, connected in series. The resistive element Na includes resistors Rn1 through Rn14 having the negative temperature coefficient and connected in series, for instance. The resistive element Nb includes resistors Rn15 through Rn17 having the negative temperature coefficient and connected in series, for instance.

A second connection change part 102 is provided to the resistive elements Pa and Na. The second connection change part 102 includes interconnection lines 105 that short-circuit the resistors Rp1 through Rp14 connected in the resistive element Pa and the resistors Rn1 through Rn14 connected in the resistive element Na, respectively. In the initial state, all the resistors Rp1 through Rp14 of the resistive element Pa and all the resistors Rn1 through Rn14 of the resistive element Na are short-circuited. As a result, the resistive elements Pa and Na do not make a substantial contribution to the resistance and the temperature coefficient of the resistive element Rf, that is, the resistive elements Pa and Na do not function as resistors.

The second connection change part 102 allows the interconnection lines 105 to be cut off as required so that one or more of the resistors Rp1 through Rp14 and Rn1 through Rn14 can function in the resistive element Rf, or can be substantially connected in the resistive element Rf. Thus, the second connection change part 102 can control the resistance and the temperature coefficient of the resistive element Rf by causing a required number of resistors having the positive temperature coefficient and a required number of resistors having the negative temperature coefficient to function in the resistive element Rf.

Further, a first connection change part 101 is provided to the resistive elements Pb and Nb. The first connection change part 101 includes a switching circuit 106 having, for instance, multiple inverters 103 and FETs (field-effect transistors) 104. In the switching circuit 106, the number of resistors of the resistors Rp15 through Rp17 that function in the resistive element Rf, or substantially get connected in the resistive element Rf, is selected (or determined) in accordance with a code input to signal lines FP1 and FP0 connected to the switching circuit 106. Likewise, the number of resistors of the resistors Rn15 through Rn17 that function in the resistive element Rf, or substantially get connected in the resistive element Rf, is selected (or determined) in accordance with a code input to signal lines FN1 and FN0 connected to the switching circuit 106. This makes it possible for the first connection change part 101 to control the resistance and the temperature coefficient of the resistive element Rf. Provision of the switching circuit 106 makes it possible to change the resistance and the temperature coefficient of the resistive element Rf with ease, and to control the resistance and the temperature coefficient of the resistive element Rf with high accuracy.

Figure 6:
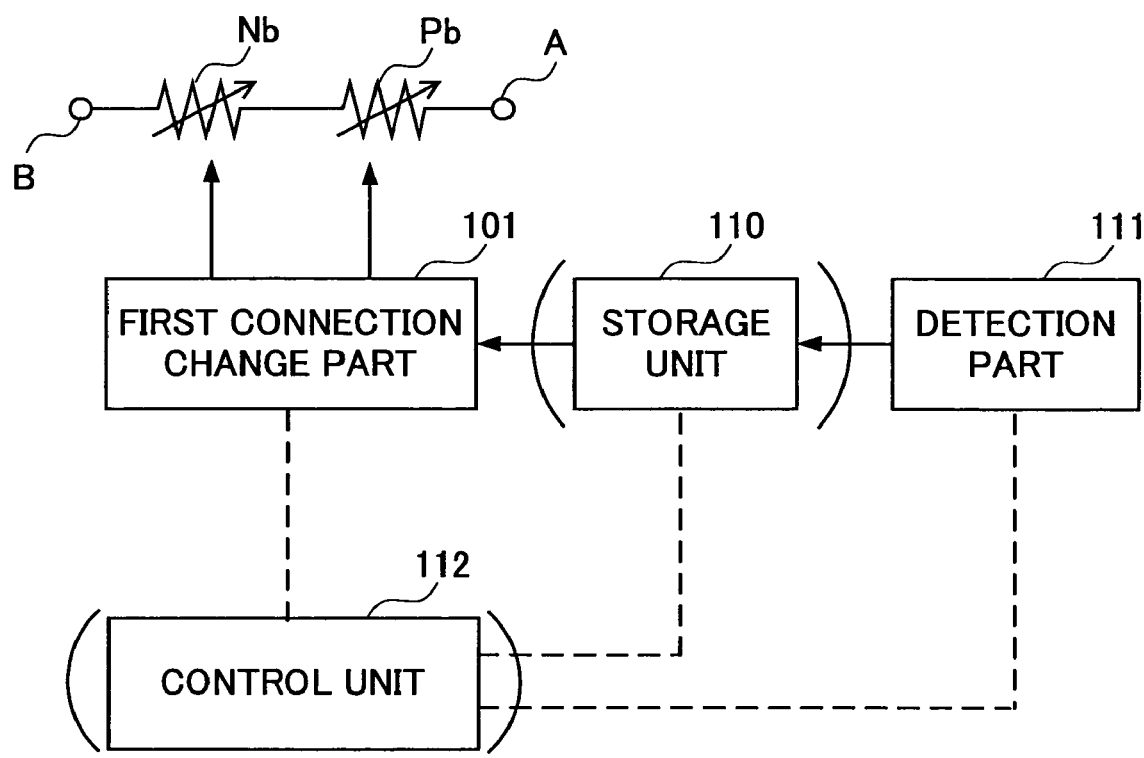
FIG. 6 is a schematic diagram illustrating a configuration of the semiconductor device according to a second embodiment of the present invention.

For instance, the number of resistors functioning in the resistive element Pb can be changed as desired by inputting signals to the signal lines FP1 and FP0 from an external or internal apparatus such as a below-described control unit or storage unit (FIG. 6). Accordingly, it is possible to change the resistance and the temperature coefficient of the resistive element Pb.

For instance, when a code "11" is input to the signal lines FP1 and FP0, such a state is entered that the resistors Rp15 through Rp17 are not connected in the resistive element Pb, that is, the resistors Rp15 through Rp17 do not function in the resistive element Pb. When a code "10" is input to the signal lines FP1 and FP0, the resistor Rp15 substantially gets connected in the resistive element Pb to function as a resistor. When a code "01" is input to the signal lines FP1 and FP0, the resistors Rp15 and Rp16 substantially get connected in the resistive element Pb to function as resistors. When a code "00" is input to the signal lines FP1 and FP0, the resistors Rp15 through Rp17 substantially get connected in the resistive element Pb to function as resistors.

Likewise, the number of resistors functioning in the resistive element Nb can be changed as desired by inputting signals to the signal lines FN1 and FN0 from an external or internal apparatus such as the below-described control unit or storage unit (FIG. 6). Accordingly, it is possible to change the resistance and the temperature coefficient of the resistive element Nb.

For instance, when a code "11" is input to the signal lines FN1 and FN0, such a state is entered that the resistors Rn15 through Rn17 are not connected in the resistive element Nb, that is, the resistors Rn15 through Rn17 do not function in the resistive element Nb. When a code "10" is input to the signal lines FN1 and FN0, the resistor Rn15 substantially gets connected in the resistive element Nb to function as a resistor. When a code "01" is input to the signal lines FN1 and FN0, the resistors Rn15 and Rn16 substantially get connected in the resistive element Nb to function as resistors. When a code "00" is input to the signal lines FN1 and FN0, the resistors Rn15 through Rn17 substantially get connected in the resistive element Nb to function as resistors.

Thus, the number of resistors of the positive temperature coefficient that function in the resistive element Rf and the number of resistors of the negative temperature coefficient that function in the resistive element Rf are changed by the first connection change part 101 and the second connection change part 102. As a result, the resistance and the temperature coefficient of the resistive element Rf, that is, the resistance and the temperature coefficient of the semiconductor device 100, are controlled.

In the case of controlling the resistance and the temperature coefficient of the resistive element Rf of the semiconductor device 100, it is possible to perform the control using either the first connection change part 101 or the second connection change part 102. Accordingly, a connection change part controlling the resistance and the temperature coefficient of the resistive element Rf can be formed of one of the first connection change part 101 and the second connection change part 102.

However, having the connection change part formed of only the first connection change part 101 complicates the configuration of the semiconductor device 100, so that there is concern over an increase in circuit scale. Meanwhile, having the connection change part formed of only the second connection change part 102 may make it difficult to accurately measure and control the resistance and characteristics relating to the temperature coefficient. Therefore, according to this embodiment, both the first connection change part 101 and the second connection change part 102 are provided as the connection change part controlling the resistance and the temperature coefficient of the resistive element Rf.

This makes it possible to simplify the configuration of the semiconductor device 100 and reduce the circuit scale of the semiconductor device 100. This also makes it possible to control the temperature coefficient-related characteristics and the resistance of the resistive element Rf, that is, the semiconductor device 100, with accuracy. Provision of the first connection change part 101 and/or the second connection change part 102 makes it possible to change the resistance and the temperature coefficient of the resistive element Rf with ease.

Further, compared with a method of correcting circuit characteristics relating to a change in temperature by adding, for instance, temperature measurement means, voltage measurement means, and correction means corresponding thereto, circuit configuration can be simplified, and circuit scale can be reduced.

For instance, the resistance and the temperature coefficient of the resistive element Rf of the semiconductor device 100 can be controlled as follows.

First, in the process of testing the semiconductor device 100, the resistance is measured with different numbers of resistors that function in the resistive element Rf, and this measurement is repeated with different temperature conditions.

First, the resistance of the resistive element Rf is measured under a first temperature condition. The resistance of the resistive element Rf is further measured with different numbers of functioning resistors (resistors functioning in the resistive element Rf) of the resistors Rp15 through Rp17 of the positive temperature coefficient and different numbers of functioning resistors of the resistors Rn15 through Rn17 of the negative temperature coefficient by changing codes provided to the signal lines FP0 and FP1 and the signal lines FN0 and FN1.

Next, the same measurement as under the first temperature condition is performed under a second temperature condition. That is, the resistance of the resistive element Rf is measured in the same manner under the different temperature condition, and the resistance of the resistive element Rf is further measured repeatedly with different numbers of functioning resistors (resistors functioning in the resistive element Rf) of the resistors Rp15 through Rp17 of the positive temperature coefficient and different numbers of functioning resistors of the resistors Rn15 through Rn17 of the negative temperature coefficient by changing codes provided to the signal lines FP0 and FP1 and the signal lines FN0 and FN1.

In this case, there is sufficient time reserved for the resistive element Rf to be adapted to ambient temperature after the ambient temperature is set to a predetermined temperature. Accordingly, the ambient temperature is substantially considered as the temperature of the resistive element Rf.

As a result, the resistances of the resistive element Rf measured under different temperature conditions are obtained, and the sheet resistance and the rate of change in resistance with respect to a change in temperature, that is, the temperature coefficient, of each of the resistors Rp15 through Rp17 and Rn15 through Rn17 forming the resistive element Rf are calculated from the measured resistances.

Next, in the process of controlling the semiconductor device 100, the number of resistors functioning in the resistive element Rf is controlled by the connection change part 102 based on the sheet resistances and the temperature coefficients measured in the test process so that the semiconductor device 100 has a desired resistance and temperature coefficient. In this case, the interconnection lines 105 are cut off with a cutting member such as a laser so that the number of resistors substantially connected in each of the resistive elements Pa and Na is controlled, thereby controlling the resistance and the temperature coefficient of the resistive element Rf. As a result, the semiconductor device 100 is controlled to have a desired resistance and temperature coefficient. For instance, it is possible to form a semiconductor device that has a low temperature coefficient, or a semiconductor device whose resistance variation with respect to a change in temperature is reduced, in a temperature range in which the semiconductor device is used.

In this case, in the finally formed resistive element Rf, the code of the signal lines FP0 and FP1 and the code of the signal lines FN0 and FN1 are set to "11" so that none of the resistors Rp15 through Rp17 and Rn15 through Rn17 substantially functions in the resistive elements Pb and Nb. Alternatively, for instance, necessary values may be entered in the codes through the below-described storage part (FIG. 6) so as to cause one or more desired resistors to function in the resistive elements Pb and Nb so that the resistive element Rf includes the resistive elements Pb and Nb.

Conventionally, in the case of, for instance, an oscillation circuit, when the resistance and the temperature coefficient of a resistive element are controlled, the output frequency (oscillation frequency) changes in accordance with the controlled resistance and temperature coefficient. Accordingly, it is difficult to perform accurate control at the stage of controlling the resistive element if the resistance and the temperature coefficient can be varied only in one direction.

According to this embodiment, since the first connection change part 101 is provided, it is possible to vary each of the resistance and the temperature coefficient of the semiconductor device 100 in both increasing and decreasing directions. As a result, compared with, for instance, the conventional case of controlling the resistance and the temperature coefficient by varying the resistance and the temperature coefficient only in one direction, it is possible to measure and control the resistance and the temperature coefficient of the semiconductor device 100 with accuracy.

Further, the switching circuit 106 is formed so that in the case of changing the number of resistors functioning in the resistive element Rf by the connection change part 101, the resistors other than the functioning resistors have the same circuit structure before and after the change. Accordingly, changes in the resistance, temperature coefficient, and impedance due to factors other than the change in the number of functioning resistors are minimized, so that it is possible to measure the resistance and the temperature coefficient with more accuracy.

It is possible to change the number of resistors employed in each of the resistive elements Pa, Pb, Na, and Nb as desired. For instance, it is preferable to preset the number of resistors of each of the resistive elements Pa, Pb, Na, and Nb so that the resistance and the temperature coefficient of the resistive element Rf realized by the resistive elements Pb and Nb and employed in the test process are values as close as possible to the resistance and the temperature coefficient of the resistive element Rf realized by the resistive elements Pab and Nab after the control process. This makes it possible to control the resistance and the temperature coefficient with more accuracy.

In the case of manufacturing an electronic device using the semiconductor device 100, it is not always necessary to measure the resistance and the temperature coefficient of the semiconductor device 100 in the test process. That is, the output of the electronic device including the semiconductor device 100 may be measured in the test process, and the number of resistors of the positive temperature coefficient functioning in the resistive element Rf (sheet number) and the number of resistors of the negative temperature coefficient functioning in the resistive element Rf (sheet number) may be controlled in the control process so that the output becomes a desired value or the temperature dependency of the output has a desired characteristic. Accordingly, the output of the electronic device can be controlled easily in its manufacturing process.

Further, in this case, with respect to various factors affecting the temperature characteristic of the circuit of the electronic device, it is possible to perform control in the control process so that the electronic device generates a desired output.

For instance, in an oscillation circuit using the semiconductor device 100, it is possible to measure the frequency of the oscillation circuit in the test process and perform control in the control process so that a desired frequency is output. As a result, it is possible to control the output frequency (oscillation frequency) of the oscillation circuit with accuracy and ease.

Combinations of the circuit and output of such an electronic device may be, but are not limited to, an oscillation circuit and an output frequency (oscillation frequency), a current control circuit and a current value, a voltage control circuit and a voltage value, a voltage detection circuit and a detected voltage, an amplifier circuit and a gain, and a filter circuit and a cut-off frequency. The present invention is applicable to the manufacturing of the circuits of a wide variety of electronic devices.

It is preferable to employ a resistor formed of a metal film for each of the resistors Rp1 through Rp17 having the positive temperature coefficient employed in this embodiment. For instance, CrSi is preferable in particular for such a resistor. Resistors formed of CrSi are employed as the resistors Rp1 through Rp17.

For instance, in the case of forming a resistor of a positive temperature coefficient by controlling the temperature coefficient by controlling the impurity density of conventionally employed polysilicon, it is difficult to increase sheet resistance. On the other hand, according to the present invention, it is possible to increase the sheet resistance of each of the resistors Rp1 through Rp17 since CrSi is employed therefor. Accordingly, it is possible to reduce resistor size in the case of attempting to obtain a desired resistance, so that it is possible to miniaturize the circuit.

Further, according to this embodiment, it is possible to increase the sheet resistance of each of the resistors having the positive temperature coefficient and the resistors having the negative temperature coefficient. Further, it is possible to reduce the difference in sheet resistance between the resistors having the positive temperature coefficient and the resistors having the negative temperature coefficient.

Therefore, according to this embodiment, compared with the case of a great difference in sheet resistance, good processing accuracy can be realized in, for instance, the process of forming the resistors having the positive temperature coefficient and the resistors having the negative temperature coefficient in the circuit, such as an etching process, and the processing process can be simplified. Further, the difference in the smallest unit of resistor size with which a desired resistance is obtained, that is, the difference in resistor resolution in the case of controlling the resistance and temperature coefficient of a resistor, between the resistors having the positive temperature coefficient and the resistors having the negative temperature coefficient is reduced, thereby simplifying the structure of the resistive element and facilitating control of the resistance and the temperature coefficient of the resistive element.

Figure 5:
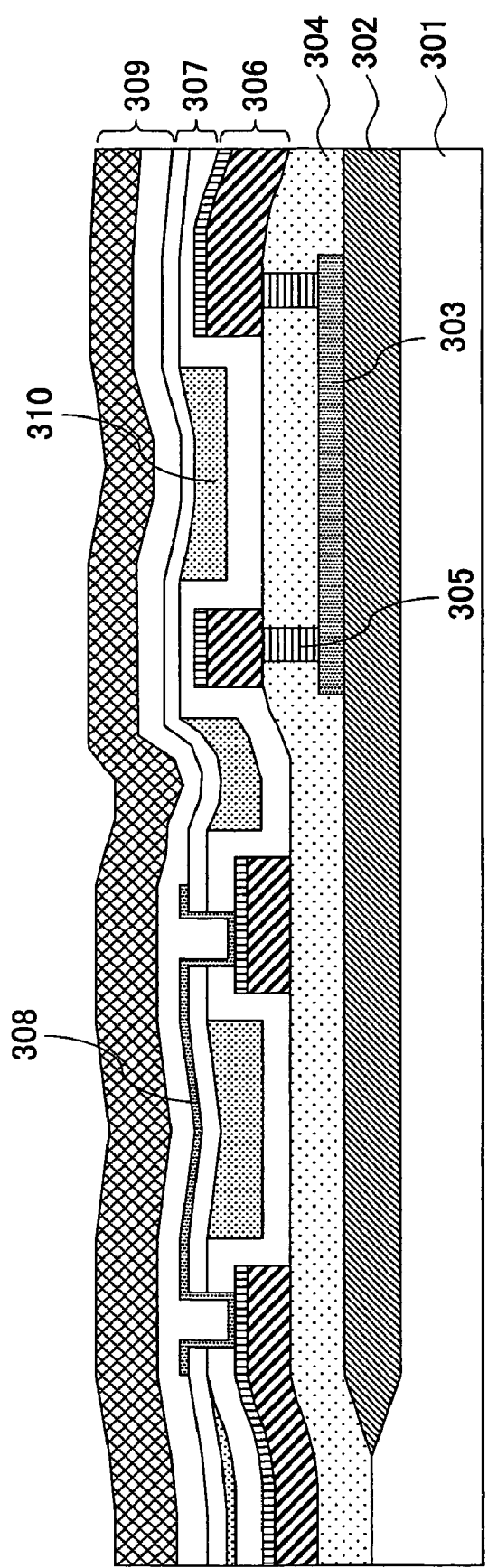
FIG. 5 is a cross-sectional view of part of the semiconductor device, illustrating the cross-sectional structures of resistors employed therein according to the first embodiment of the present invention.

FIG. 5 is a cross-sectional view of part of the semiconductor device 100, illustrating the cross-sectional structures of resistors employed in this embodiment.

Referring to FIG. 5, an isolation oxide film 302 is formed on a substrate 301, and a resistor 303 of patterned polysilicon is formed on the isolation oxide film 302. The resistor 303 forms a resistor having a negative temperature coefficient. An interlayer insulating film 304 is formed so as to cover the resistor 303. A metal via plug 305 is formed in each contact hole formed in the interlayer insulating film 304.

Patterned metal interconnection lines 306, whose main component is Al, are formed on the interlayer insulating film 304. A film preventing reflection of light of exposure at the time of patterning or a film having a barrier function may be formed on the surface of the metal interconnection lines 306.

An interlayer insulating film 307 is formed so as to cover the metal interconnection lines 306. Further, an insulating film 310 is formed in recesses in the interlayer insulating film 307 so as to flatten the interlayer insulating film 307.

Part of the patterned metal interconnection lines 306 is electrically connected to the via plugs 305. Further, a resistor 308 of CrSi having a positive temperature coefficient is formed so as to be connected to another part of the patterned metal interconnection lines 306. In this case, a thin film of CrSi is formed on the inner wall of each of multiple contact holes formed in the interlayer insulating film 307 so as to reach the interconnection lines 306, and a thin film of CrSi is formed on the interlayer insulating film 307 so as to be electrically connected to the CrSi thin film on the inner wall of each contact hole, thereby forming the resistor 308.

For instance, the resistor 308 is formed as follows. First, contact holes are formed in the interlayer insulating film 307 by patterning and etching by photolithography. Next, a CrSi thin film is formed on the interlayer insulating film 307 including the inner wall of each contact hole by sputtering using, for instance, a CrSi target. Then, the resistor 308 of the CrSi thin film patterned as illustrated in FIG. 5 is formed by patterning and etching by photolithography.

Further, a protection film (passivation film) 309 is formed so as to cover the resistor 308 and the interlayer insulating film 307.

The isolation insulating film 302 may be formed by, for instance, thermal CVD. Further, the interlayer insulating films 304 and 307 and the protection film 309 may be formed by, for instance, plasma CVD. Boron (B) or phosphorus (P) may be added to the interlayer insulating film 304 as required.

Further, the insulating film 310 is formed of a coated film using, for instance, SOG (spin-on glass). In this case, by flattening the coated film by CMP (chemical mechanical polishing), the insulating film 310 suitably has better flatness.

The resistor 308 having the positive temperature coefficient formed by forming and etching a thin film can have a higher sheet resistance and be finer than a resistor formed by, for instance, impurity diffusion.

Second Embodiment

The semiconductor device 100 may also be configured as follows. FIG. 6 is a schematic diagram illustrating a variation (configuration) of the semiconductor device 100 according to a second embodiment of the present invention. In FIG. 6, the same elements as those described above are referred to by the same numerals, and a description thereof is omitted.

Referring to FIG. 6, the semiconductor device 100 includes a detection part 111. The detection part 111 detects a change in the environment of the semiconductor device 100, such as a change in temperature. Employment of the detection part 111 makes it possible to provide the semiconductor device 100 with good characteristics irrespective of environmental changes.

The connection change part 101 may select the sheet number of the positive functioning resistors (the number of resistors of the positive temperature coefficient that function, that is, substantially get connected, in the resistive element Rf) and the sheet number of the negative functioning resistors (the number of resistors of the negative temperature coefficient that function, that is, substantially get connected, in the resistive element Rf) in accordance with the temperature change detected by the detection part 111.

In this case, it is possible to control the temperature coefficient of the resistive element Rf with accuracy in a wider temperature range than in the case of the first embodiment.

For instance, in the case of controlling the temperature coefficient according to the method described in the first embodiment, good results of temperature coefficient control can be obtained in the temperature range between two points (temperatures) used for the control. However, a desired control result may not be obtained in a temperature range away from the temperature range between the two points used for the control. According to this embodiment, it is possible to control the temperature coefficient with accuracy even in such a temperature range. A description is given below, with reference to FIG. 8, of a specific case of the control of the temperature coefficient in such a temperature range.

Further, in this case, the semiconductor device 100 may include a storage unit 110 storing, for instance, signals such as codes to be input to the first connection change part 101 in accordance with the temperature change detected by the detection part 111, that is, information for driving the first connection change part 101. In this case, the sheet number of the positive functioning resistors and the sheet number of the negative functioning resistors can be changed quickly in accordance with the temperature change.

Further, for instance, a control unit 112 connected to the detection part 111, the storage unit 110, and the first connection change part 101 may be employed. In response to the temperature change (environmental change) detected by the detection part 111, the control unit 112 reads the number of resistors to be caused to function in the resistive element Rf (sheet number) from the storage unit 110, and controls the first connection change part 101 in accordance with the read sheet number to change the number of resistors to be caused to function in the resistive element Rf.

The control unit 112 may include the storage unit 110 and the detection part 111. Alternatively, the detection part 111 may include the storage unit 110, or the detection part 111 may include the storage unit 110 and the control unit 112. Thus, variations and modifications may be performed in application.

Third Embodiment

Figure 7:
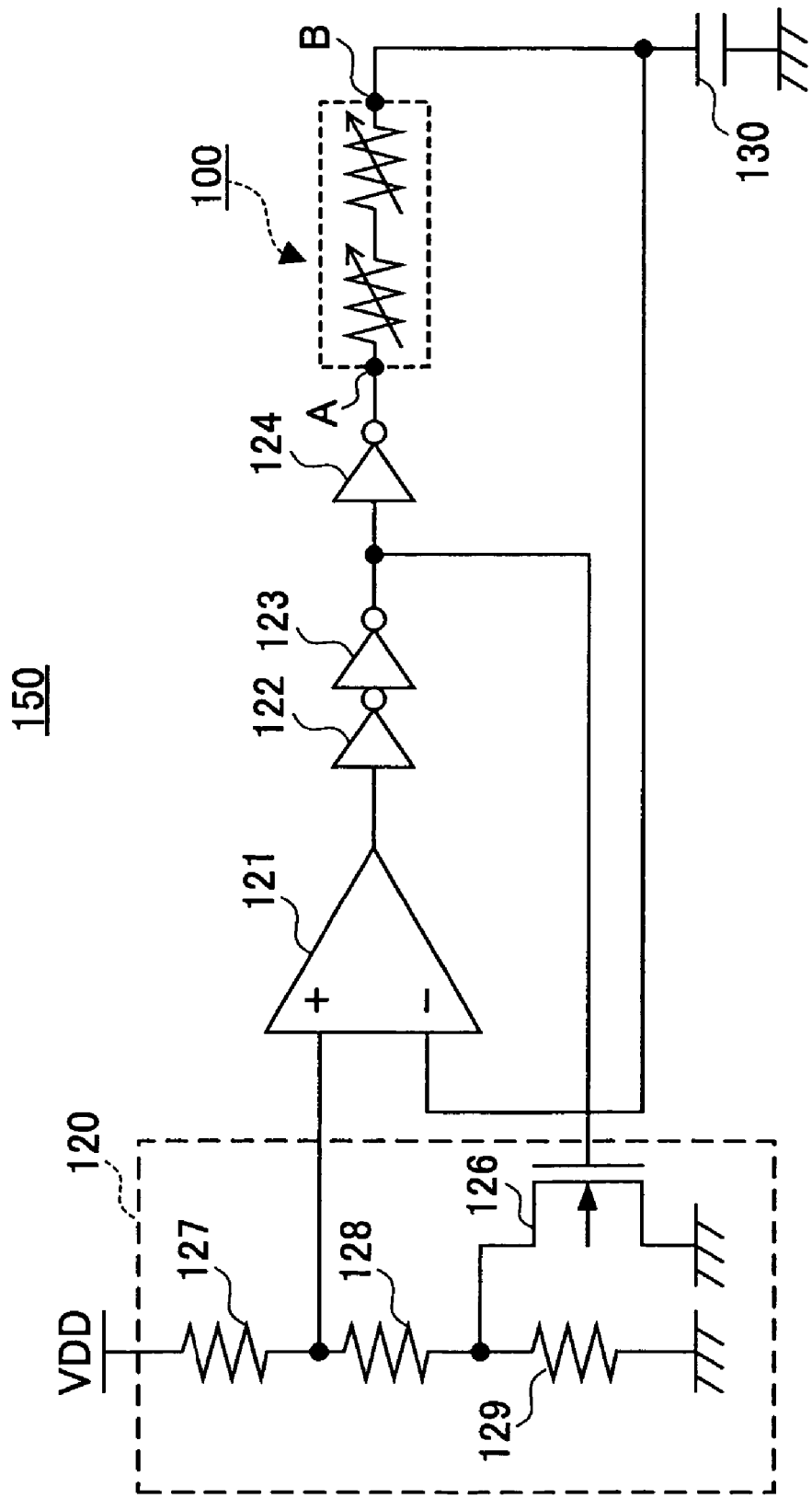
FIG. 7 is a circuit diagram illustrating an electronic device according to a third embodiment of the present invention.

The semiconductor device 100 may be applied to a wide variety of electronic devices. FIG. 7 is a circuit diagram illustrating an electronic device 150 in which the semiconductor device 100 is applied to a CR oscillation circuit according to a third embodiment of the present invention. In FIG. 7, the same elements as those described above are referred to by the same numerals, and a description thereof is omitted.

In the case of FIG. 7, the number of resistors of the semiconductor device 100 is changed from that in the case of FIG. 4. Thus, the number of resistors and the sheet number of resistors are changed as desired when employed in the semiconductor device 100. The same holds true for the following embodiments.

Referring to FIG. 7, the electronic device 150 having an oscillation circuit includes a comparator 121, a reference voltage generator circuit 120, a capacitor 130, the semiconductor device 100, and inverters 122, 123, and 124. The capacitor 130 and the semiconductor device 100 are connected in series between the output of the inverter 124 and ground so as to form a charging and discharging circuit. The inverting input terminal of the comparator 121 is connected to the connection node of the capacitor 130 and the semiconductor device 100. A reference voltage that is the output of the reference voltage generator circuit 120 is input to the non-inverting input terminal of the comparator 121.

The reference voltage generator circuit 120 includes resistors 127, 128, and 129 connected in series between a power supply and ground. An FET 126 is connected to the connection node of the resistors 128 and 129. The reference voltage generated by dividing voltage in the reference voltage generator circuit 120 is input to the non-inverting input terminal of the comparator 121.

According to the electronic device 150 including an oscillation circuit according to this embodiment, it is possible to control the resistance and the temperature coefficient of the semiconductor device 100 to desired values with accuracy, so that it is possible to control the oscillation frequency to a desired value with accuracy.

Conventionally, in the case of measuring the resistance and the temperature coefficient of a resistive element, there is a problem in that the effects of a measurement instrument are different from actual operational conditions, and that the effects of circuit operation delay and the bias conditions of a capacitor and the resistive element cannot be reflected. Accordingly, it is difficult to control the resistance and the temperature coefficient with accuracy, and it is difficult to control the resistance in accordance with actual circuit operations using a desired frequency that is ultimately employed.

Meanwhile, according to this embodiment, it is possible to control the resistance of the semiconductor device 100 at a desired frequency. That is, it is possible to check a change in output by changing the proportion of one to the other of two types of resistors having different temperature coefficients while the actual circuit is caused to operate, controlling the resistance so that the frequency is set to a desired value. Accordingly, it is possible to adjust the frequency of the oscillation circuit with high accuracy. Further, it is possible to control and suppress effects that cause a change in the oscillation circuit by changing the resistance and the temperature coefficient of the resistive element Rf of the semiconductor device 100.

Therefore, it is possible to not only control the resistance and the temperature coefficient of in the semiconductor device 100 with high accuracy, but also suppress various factors affecting parts other than the semiconductor device 100 in the circuit in which the semiconductor device 100 is employed. For instance, it is possible to control or suppress effects that changes in resistance in various parts of the circuit have on circuit operations.

Figure 8:
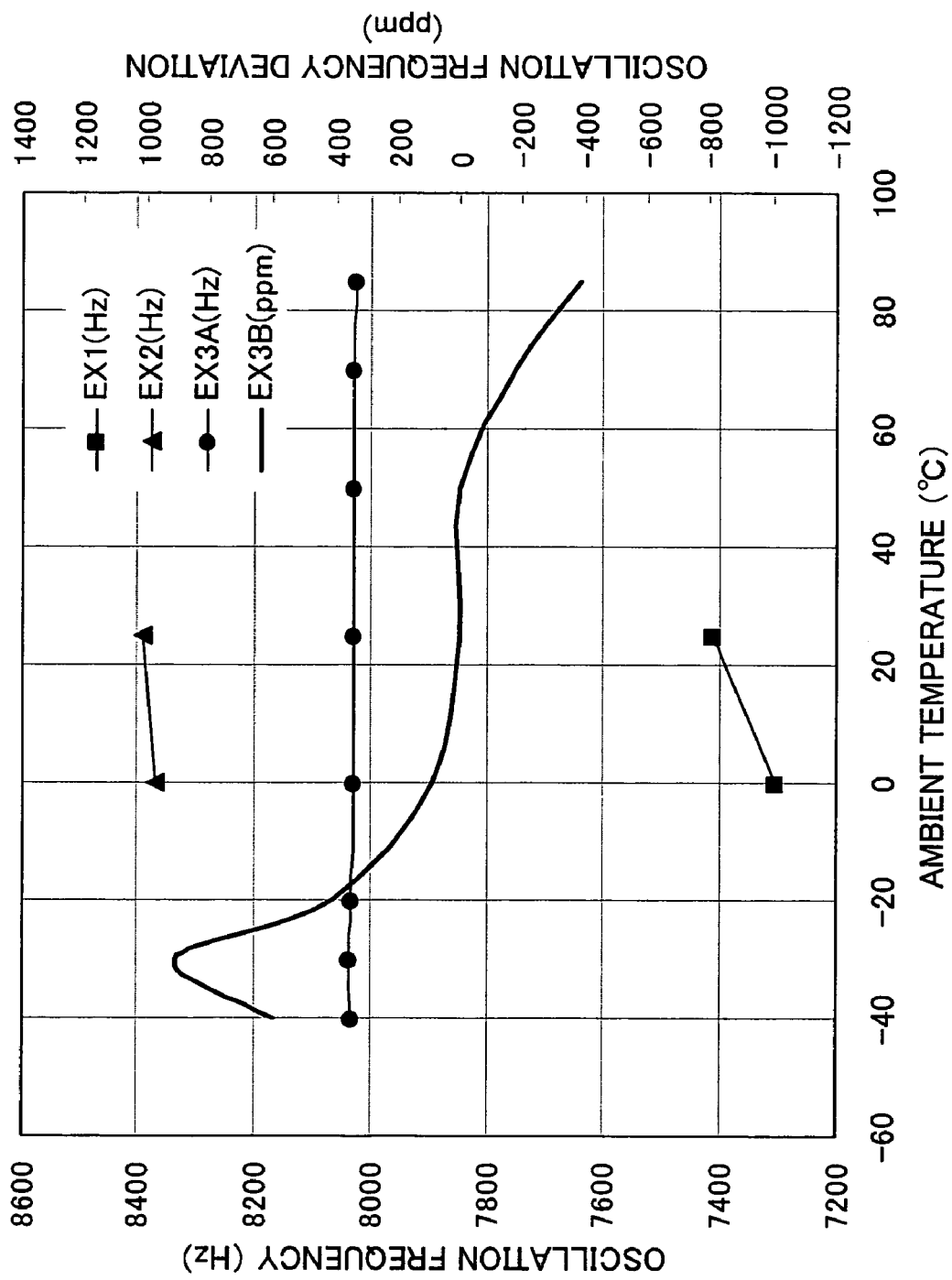
FIG. 8 is a graph illustrating a state where the oscillation frequency of the electronic device changes with temperature according to the third embodiment of the present invention.

FIG. 8 is a graph illustrating a state where the oscillation frequency of the oscillation circuit of the electronic device 150 illustrated in FIG. 7 according to this embodiment changes with temperature. Oscillation frequencies with respect to temperature and deviations (ppm) of an oscillation frequency at ordinary temperature with respect to temperature are illustrated. In FIG. 8, EX1 shows the results of the oscillation frequency in the case of connecting 480 sheets of resistors having a positive temperature coefficient and 384 sheets of resistors having a negative temperature coefficient in the resistive element Rf, and EX2 shows oscillation frequencies in the case of connecting 768 sheets of resistors having a positive temperature coefficient and 64 sheets of resistors having a negative temperature coefficient in the same manner. In each case, measurements were performed when the ambient temperature of the resistive element Rf was 0° C. and 25° C. In each case, there was sufficient time reserved for the resistive element Rf to be adapted to ambient temperature before the measurement. Accordingly, the ambient temperature substantially indicates the temperature of the resistive element Rf.

Further, EX3A shows oscillation frequencies after optimizing the number of resistors having the positive temperature coefficient and the number of resistors having the negative temperature coefficient to be connected in the semiconductor device 100 (sheet numbers) based on the results of EX1 and EX2. EX3B shows oscillation frequency deviations after the control (optimization) was performed.

In this case, the temperature coefficient of a metal film (CrSi) having the positive temperature coefficient was 28.6 ppm/° C., the temperature coefficient of a resistor (polysilicon) having the positive temperature coefficient was −1800 ppm/° C., and a target frequency was 8 kHz.

FIG. 8 shows that the absolute accuracy of the oscillation frequency is controlled after the control. Further, the temperature dependency of the oscillation frequency is controlled, which indicates that a change in the state of the circuit including the semiconductor device 100 due to a change in temperature, such as the temperature coefficient of the resistance, is reduced. In addition to the case illustrated in FIG. 8, a study was made of a case where the temperature coefficient of the metal film (CrSi) having the positive temperature coefficient was 18.4 ppm/° C. and a case where the temperature coefficient of the metal film (CrSi) having the positive temperature coefficient was 46.0 ppm/° C. In each case, a frequency absolute accuracy at the ordinary temperature (25° C.) is less than 1% error, and frequency deviations from the ordinary temperature (25° C.) within a temperature range of 0-50° C. are less than ±200 ppm.

In a temperature range lower than or equal to 0° C. and higher than or equal to 50° C., oscillation frequency deviations are somewhat greater. This can be corrected more accurately by the following method.

For instance, as described in the second embodiment, the detection part 111 (FIG. 6) may be provided in the semiconductor device 100 so that the detection part 111 may detect a change in the environment of the semiconductor device 100, such as a change in temperature, and the connection change part 101 may select the sheet number of the positive functioning resistors (the number of resistors of the positive temperature coefficient that function, that is, substantially get connected, in the resistive element Rf) and the sheet number of the negative functioning resistors (the number of resistors of the negative temperature coefficient that function, that is, substantially get connected, in the resistive element Rf) in accordance with the temperature change detected by the detection part 111.

In this case, it is possible to control the temperature coefficient of the resistive element Rf and reduce oscillation frequency deviations in a wider temperature range such as a temperature range lower than or equal to 0° C. and higher than or equal to 50° C.

Further, in this case, an optimal solution in a part where the temperature coefficient is not optimized may be stored in the storage unit 110 (FIG. 6) such as an E$^2$PROM. As a result, the sheet number of the positive functioning resistors and the sheet number of the negative functioning resistors can be changed quickly in response to the temperature change in accordance with signals such as codes stored in the storage unit 110, that is, information for driving the first connection change part 101.

The type of electronic device to which the semiconductor device 100 is applicable is not limited to the electronic device 150 of this embodiment. The semiconductor device 100 is also applicable to an electronic device shown below.

Fourth Embodiment

Figure 9A:
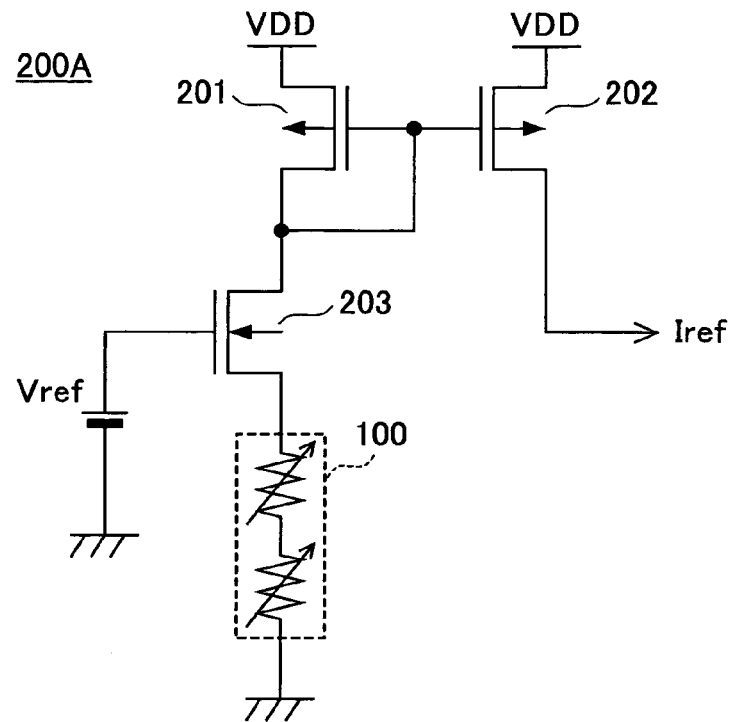
FIGS. 9A and 9B are circuit diagrams illustrating electronic devices according to a fourth embodiment of the present invention.
Figure 9B:
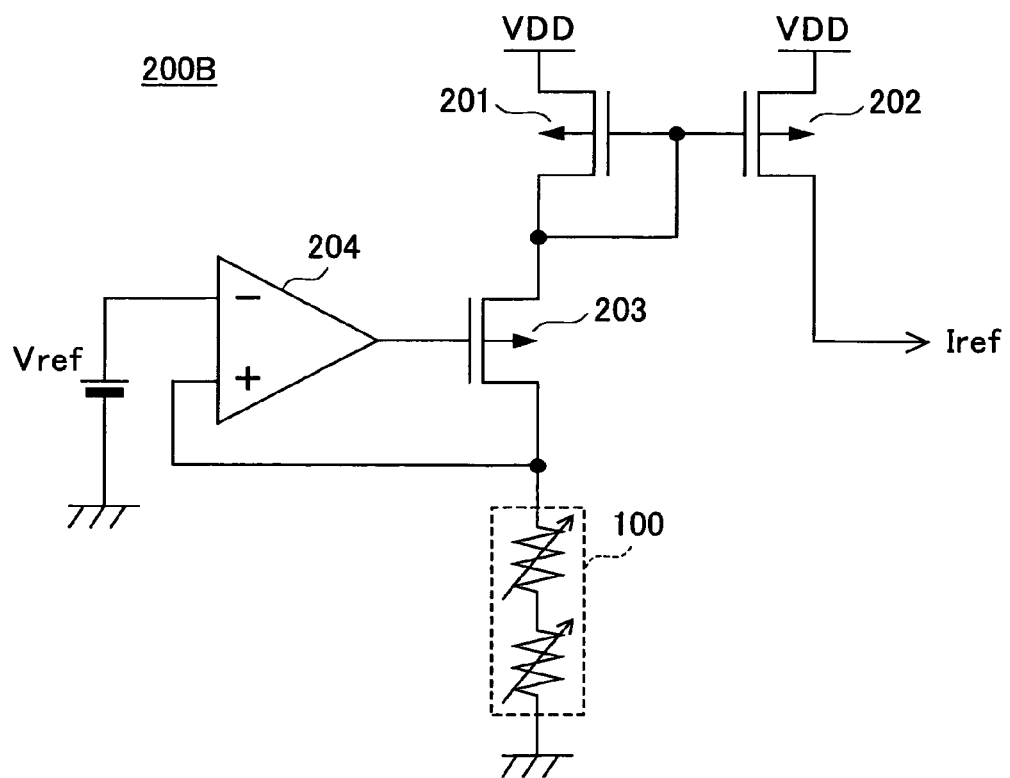

FIGS. 9A and 9B are circuit diagrams illustrating electronic devices 200A and 200B, respectively, each including a current control circuit such as a constant current circuit, according to a fourth embodiment of the present invention. In FIG. 9B, the same elements as those of FIG. 9A are referred to by the same numerals, and a description thereof is partly omitted.

Referring to FIG. 9A, according to the electronic device 200A, a reference voltage (Vref) is input to the gate of an FET 203 forming a source follower, and the through current of the FET 203 is controlled to be equalized with Vref voltage/the resistance of the semiconductor device 100. The through current passing through the FET 203 is multiplied by a coefficient by the current mirror circuit of FETs 201 and 202, so that a constant current can be output.

Further, as in the electronic device 200B illustrated in FIG. 9B, an amplifier 204 may be employed in a part forming the source follower.

In this embodiment, it is possible to control the absolute accuracy and the temperature characteristic of an output voltage with higher accuracy by using the semiconductor device 100 by connecting the semiconductor device 100 between the FET 203 and ground as a current control resistor because the resistance of the semiconductor device 100 and its rate of change in resistance due to a change in temperature can be controlled.

For instance, in a case where the given reference voltage varies because of temperature or in a case where there are factors of variations in an output current due to variations in the threshold of the FET 203 and in the FETs 201 and 202, it is possible to correct these variation factors and obtain a stable output current with the semiconductor device 100. Further, it is also possible to actively provide the output current with a temperature gradient.

Fifth Embodiment

Figure 10A:
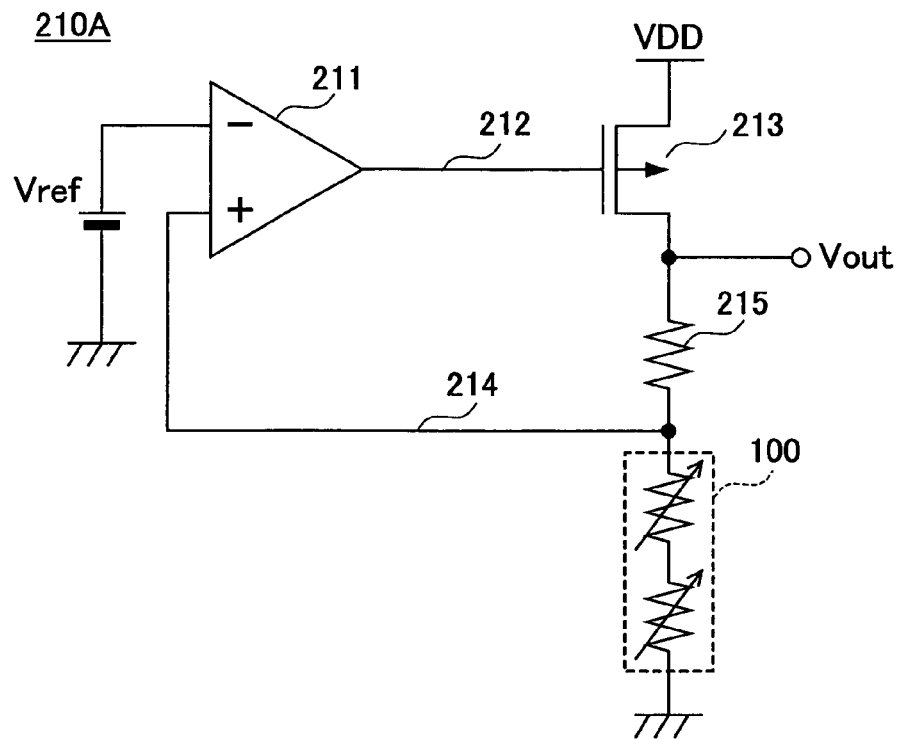
FIGS. 10A and 10B are circuit diagrams illustrating electronic devices according to a fifth embodiment of the present invention.
Figure 10B:
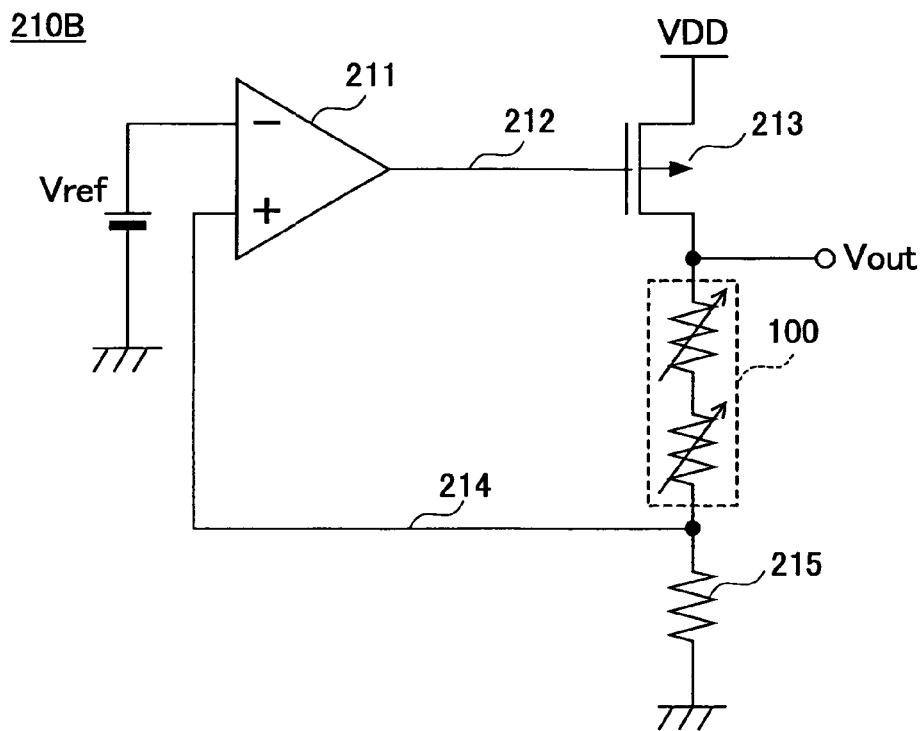

FIGS. 10A and 10B are circuit diagrams illustrating electronic devices 210A and 210B, respectively, each including a voltage control circuit such as a constant voltage circuit, according to a fifth embodiment of the present invention. In FIG. 10B, the same elements as those of FIG. 10A are referred to by the same numerals, and a description thereof is omitted.

Referring to FIG. 10A, the electronic device 210A includes an amplifier 211, an FET 213, a resistor 215, and the semiconductor device 100. The FET 213, the resistor 215, and the semiconductor device 100 are connected in series between a power supply and ground. The connection node of the resistor 215 and the semiconductor device 100 is connected to the non-inverting input terminal of the amplifier 211. A reference voltage (Vref) is input to the inverting input terminal of the amplifier 211. The output terminal of the amplifier 211 is connected to the gate of the FET 213. In this embodiment, the semiconductor device 100 is employed as a resistor for detecting the output voltage of the constant voltage circuit.

In the electronic device 210A of this embodiment, the amplifier 211 compares a divided voltage component and the reference voltage, and controls the gate voltage of the FET 213 forming an output driver. The divided voltage component is formed by the voltage divider resistors of the semiconductor device 100 and the resistor 215. In this case, the output voltage is controlled to be equalized with Vref voltage×(the resistance of the resistor 215+the resistance of the semiconductor device 100)/(the resistance of the semiconductor device 100).

The semiconductor device 100 and the resistor 215 forming the voltage dividing resistors forming the divided voltage component in the electronic device 210A may be interchanged as in the electronic device 210B illustrated in FIG. 10B.

According to this embodiment, employment of the semiconductor device 100 makes it possible to control the absolute accuracy and the temperature characteristic of the output voltage with high accuracy. Further, it is also possible to control the effects of variations in the reference voltage and components due to temperature. Further, it is also possible to actively provide the output voltage with a temperature gradient.

Sixth Embodiment

Figure 11A:
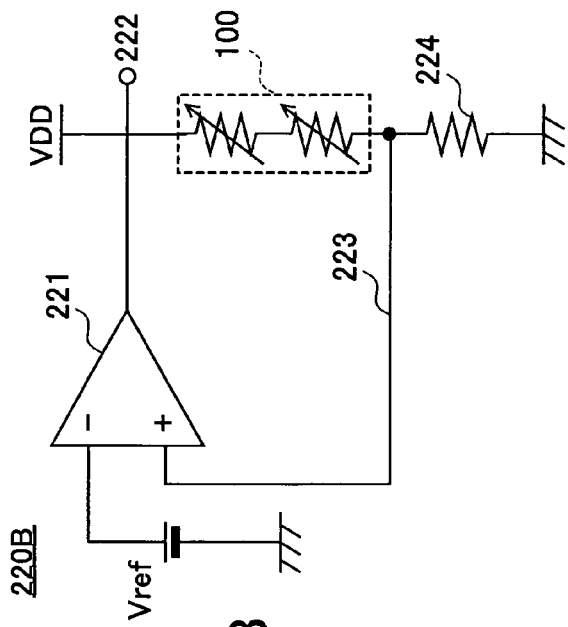
FIGS. 11A through 11D are circuit diagrams illustrating electronic devices according to a sixth embodiment of the present invention.
Figure 11B:
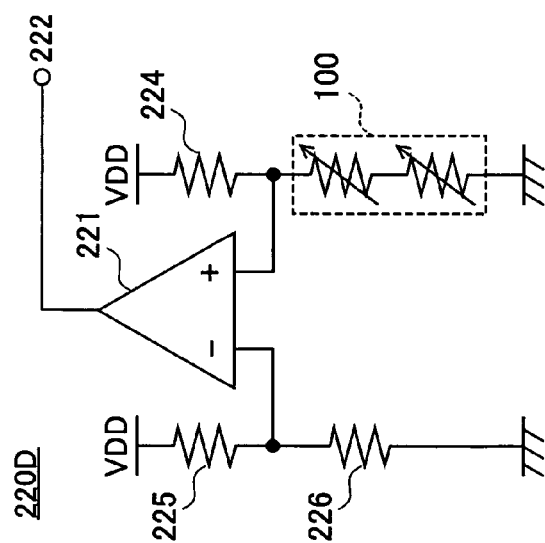
Figure 11C:
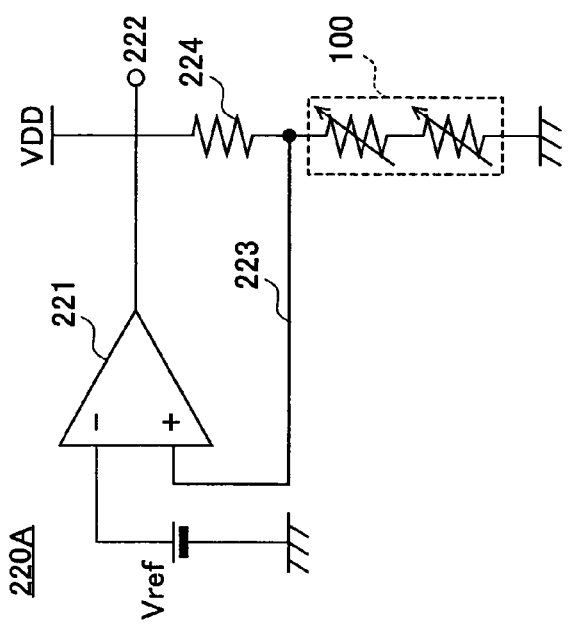
Figure 11D:
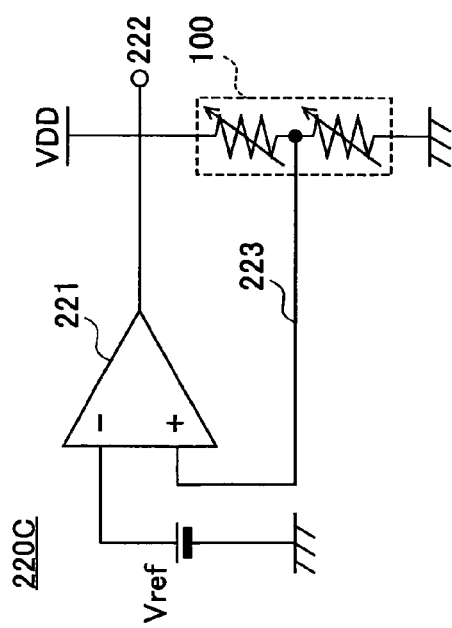

FIGS. 11A through 11D are circuit diagrams illustrating electronic devices 220A through 220D, respectively, each including a detector circuit such as a voltage detection circuit, according to a sixth embodiment of the present invention. In FIGS. 11B through 11D, the same elements as those of FIG. 11A are referred to by the same numerals, and a description thereof is partly omitted.

Referring to FIG. 11A, the electronic device 220A includes an amplifier 221, a resistor 224, and the semiconductor device 100. The resistor 224 and the semiconductor device 100, forming voltage dividing resistors forming a divided voltage component, are connected in series between a power supply and ground. The connection node of the resistor 224 and the semiconductor device 100 is connected to the non-inverting input terminal of the amplifier 221. A reference voltage (Vref) is input to the inverting input terminal of the amplifier 221. In this embodiment, the semiconductor device 100 is employed as the detection resistor of a voltage detector circuit.

The semiconductor device 100 and the resistor 224 forming the voltage dividing resistors forming the divided voltage component may be interchanged as in the electronic device 220B illustrated in FIG. 11B. Alternatively, the voltage dividing resistors forming the divided voltage component may be formed of the resistive elements Pab and Nab of the semiconductor device 100 with the non-inverting input terminal of the amplifier 221 being connected to the connection node of the resistive elements Pab and Nab.

In the electronic devices 220A through 220C illustrated in FIG. 11A through 11C, the amplifier 221 compares the divided voltage component of the supply voltage and the reference voltage, and when the divided voltage of the supply voltage falls below the reference voltage, an output 222 of the amplifier 221 is inverted so that a detection operation is performed. In the case of detecting voltage other than that of the power supply, the voltage to be detected may be input to where the power supply is input. Further, the input terminals of the amplifier 221 may be interchanged.

Figure 1:
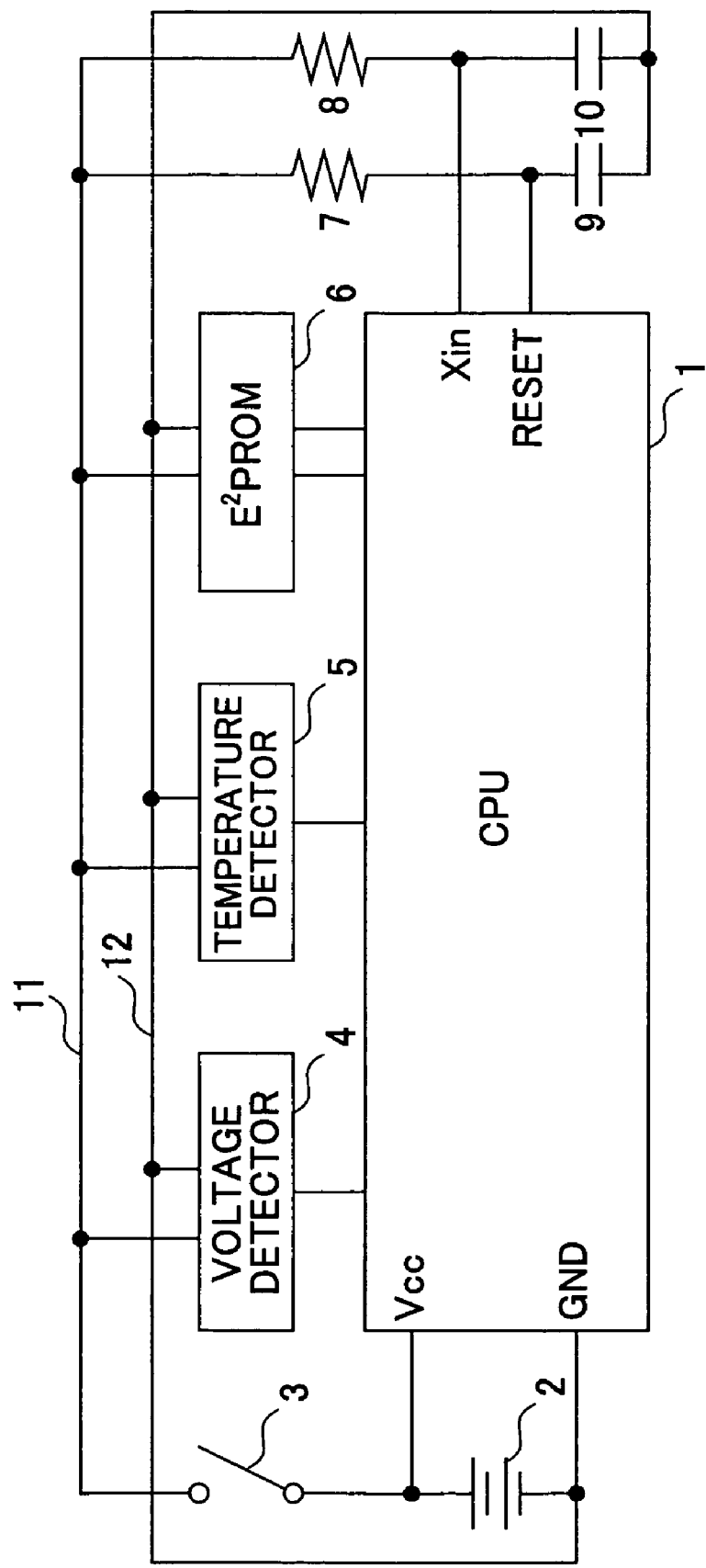
FIG. 1 is a circuit diagram illustrating a conventional correction device for correcting variations in an oscillation frequency.
Figure 2:
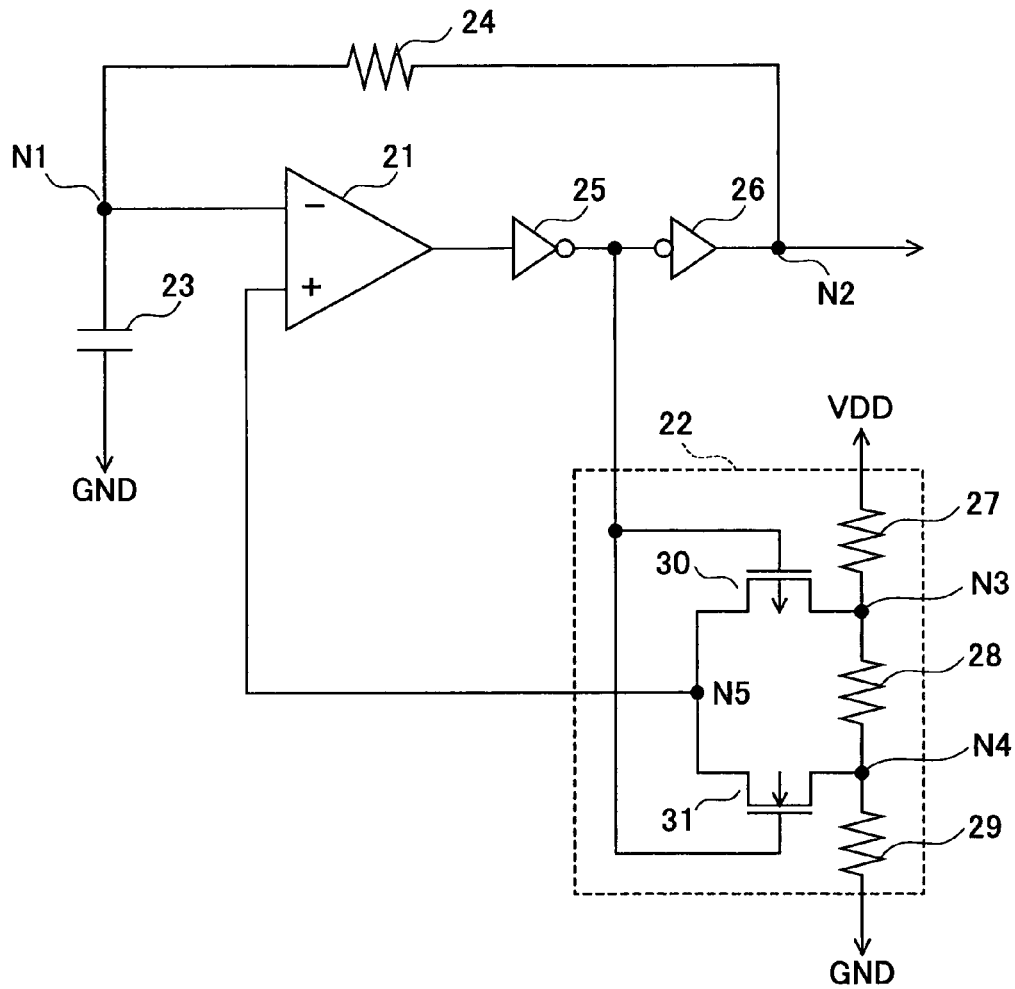
FIG. 2 is a circuit diagram illustrating a conventional CR oscillation circuit.
Figure 3:
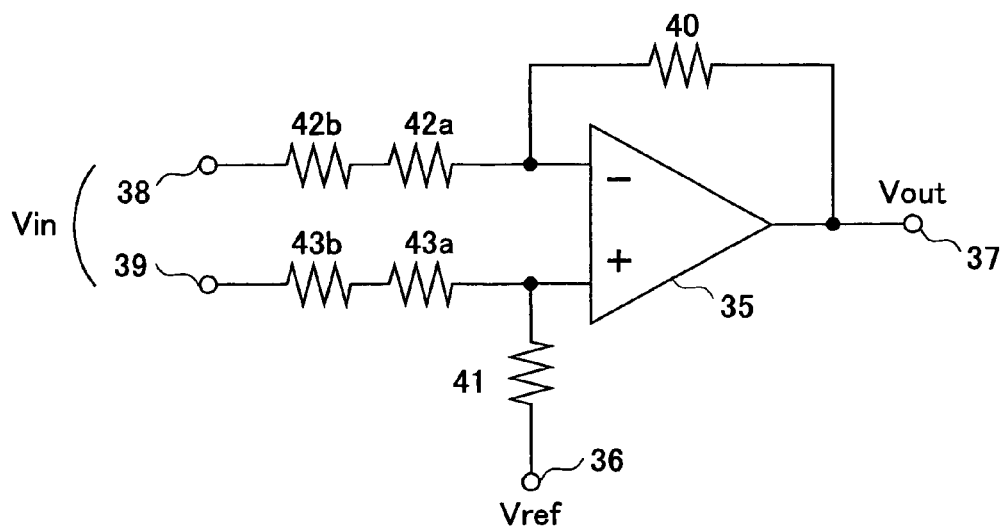
FIG. 3 is a circuit diagram illustrating a conventional amplifier circuit.

Further, as in the electronic device 220D illustrated in FIG. 1D, a divided voltage component formed by resistors 225 and 226 connected between a power supply and ground may be input to the inverting input terminal of the amplifier 221. In this case, the divided voltages input to the inverting input terminal and the non-inverting input terminal are compared.

According to the electronic devices 220A through 220C illustrated in FIGS. 11A through 11C, respectively, part or all of the voltage dividing resistors are formed using the semiconductor device 100. As a result, it is possible to provide any temperature gradient to the voltage divided component compared with the reference voltage, so that it is possible to set the temperature gradient of a detected voltage as desired. Further, as in the case of the fifth embodiment, it is possible to control the effects of variations in the reference voltage and components due to temperature.

Further, according to the electronic device 220D illustrated in FIG. 11D, in addition to the above-described effects, it is possible to realize a temperature detector circuit whose output is inverted at a specific temperature. Such a temperature detector circuit is also realizable when the supply voltage is made constant in the electronic device 220C illustrated in FIG. 11D.

Seventh Embodiment

Figure 12B:
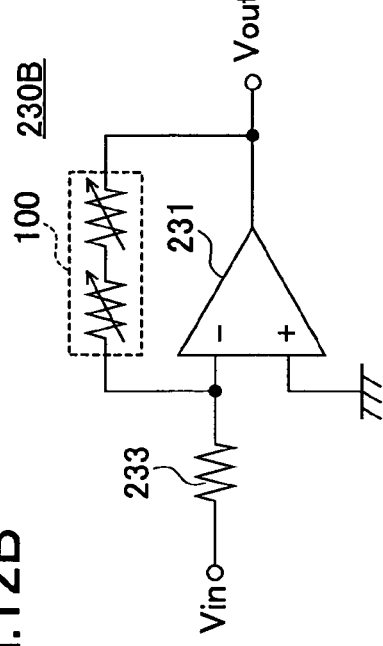
FIGS. 12A through 12D are circuit diagrams illustrating electronic devices according to a seventh embodiment of the present invention.
Figure 12D:
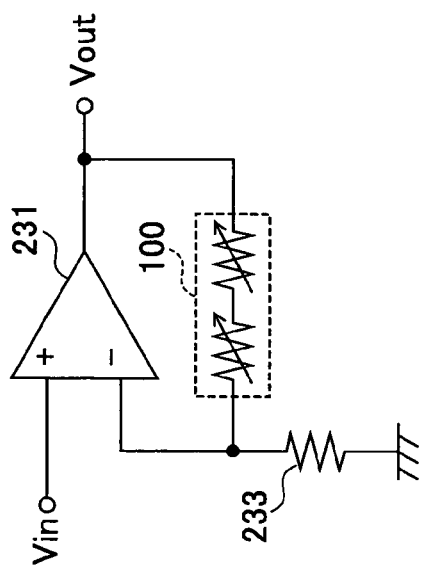
Figure 12A:
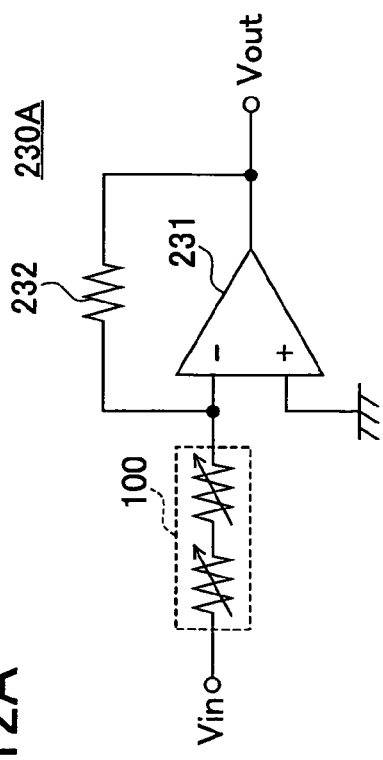
Figure 12C:
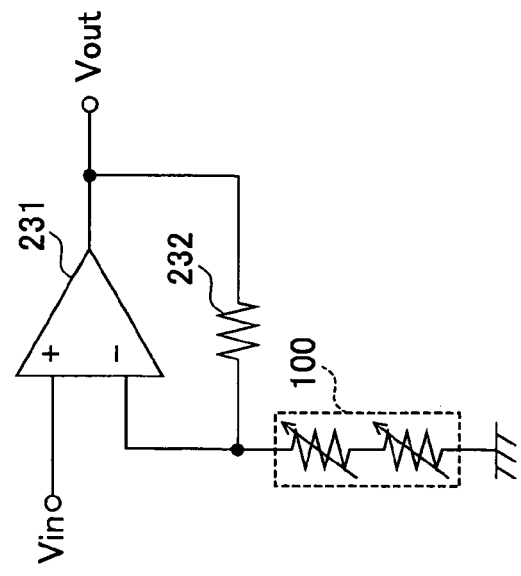

FIGS. 12A through 12D are circuit diagrams illustrating electronic devices 230A through 230D, respectively, each including an amplifier circuit such as an operational amplifier circuit, according to a seventh embodiment of the present invention. Each of the electronic devices 230A and 230B illustrated in FIGS. 12A and 12B includes, for instance, an inverting amplifier circuit, and each of the electronic devices 230C and 230D illustrated in FIGS. 12C and 12D includes, for instance, a non-inverting amplifier circuit. In FIGS. 12B through 12D, the same elements as those of FIG. 12A are referred to by the same numerals, and a description thereof is partly omitted.

Referring to FIG. 12A, the electronic device 230A includes an operational amplifier 231, a resistor 232, and the semiconductor device 100. The non-inverting input terminal of the operational amplifier 231 is connected to ground, and the inverting input terminal of the operational amplifier 231 is connected to a voltage input terminal Vin via the semiconductor device 100. The output terminal Vout of the operational amplifier 231 is connected to the inverting input terminal thereof via the resistor 232.

The electronic device 230B illustrated in FIG. 12B is similar in structure to the electronic device 230A. According to the electronic device 230B, a resistor 233 replaces the semiconductor device 100 of the electronic device 230A, and the semiconductor device 100 replaces the resistor 232 of the electronic device 230A.

In the electronic device 230C illustrated in FIG. 12C, the inverting input terminal of the operational amplifier 231 is connected to ground via the semiconductor device 100, and the non-inverting input terminal of the operational amplifier 231 is connected to the voltage input terminal Vin. The output terminal Vout of the operational amplifier 231 is connected to the inverting input terminal thereof via the resistor 232.

The electronic device 230D illustrated in FIG. 12D is similar in structure to the electronic device 230C. According to the electronic device 230D, the resistor 233 replaces the semiconductor device 100 of the electronic device 230C, and the semiconductor device 100 replaces the resistor 232 of the electronic device 230C.

In the case of employing the semiconductor device 100 as part of such amplifier circuits, it is possible to control the effects of changes in the components of electronic devices due to temperature, so that, for instance, the temperature characteristic of a gain can be corrected. Further, it is also possible to provide a gain with a desired temperature characteristic.

Eighth Embodiment

Figure 13A:
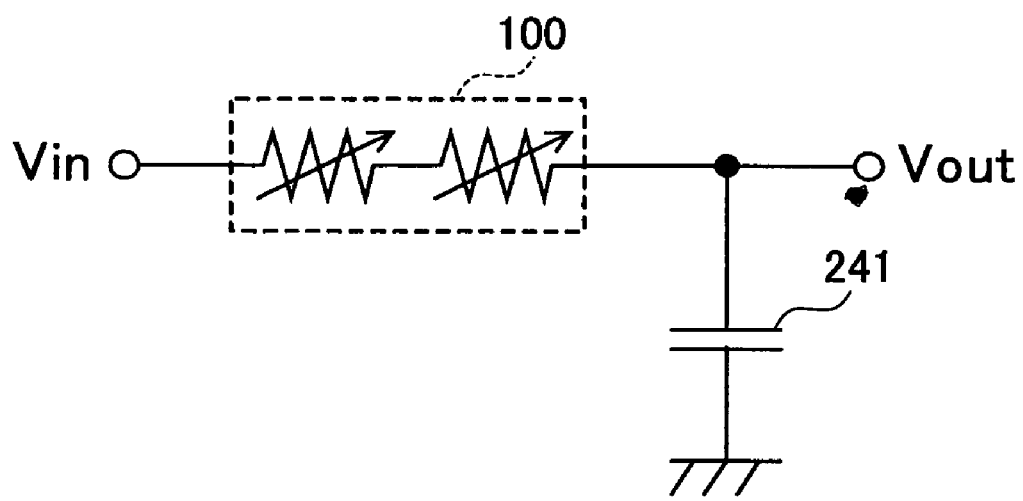
FIGS. 13A and 13B are circuit diagrams illustrating electronic devices according to an eighth embodiment of the present invention.
Figure 13B:
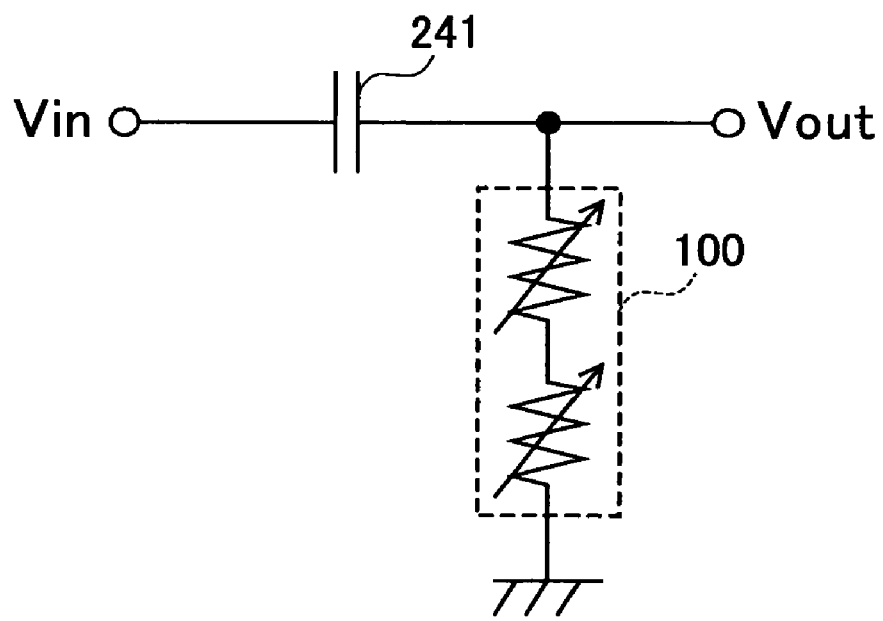

FIGS. 13A and 13B are circuit diagrams illustrating electronic devices 240A and 240B, respectively, each including a filter circuit, according to an eighth embodiment of the present invention. The electronic device 240A illustrated in FIG. 13A includes, for instance, a low-pass filter circuit, and the electronic device 240B illustrated in FIG. 13B includes, for instance, a high-pass filter circuit.

In the electronic device 240A, the semiconductor device 100 is connected between a voltage input terminal Vin and a voltage output terminal Vout, and the voltage output terminal Vout is connected to ground via a capacitor 241, thereby forming a low-pass filter. In the electronic device 240B, the capacitor 241 is connected between a voltage input terminal Vin and a voltage output terminal Vout, and the voltage output terminal Vout is connected to ground via the semiconductor device 100, thereby forming a high-pass filter.

In each of the electronic devices 240A and 240B including a filter circuit according to this embodiment, employment of the semiconductor device 100 makes it possible to control the absolute value of a cut-off frequency and a change in the cut-off frequency due to temperature with high accuracy, and also to actively change the cut-off frequency by temperature. An electronic device using the semiconductor device 100 is applicable not only to a primary filter by a CR circuit as illustrated in this embodiment, but also to, for instance, various active filter circuits formed by combining amplifiers.

Ninth Embodiment

In addition to the electronic device 150 illustrated in FIG. 7, the semiconductor device 100 is applicable to electronic devices including various oscillation circuits.

Figure 14A:
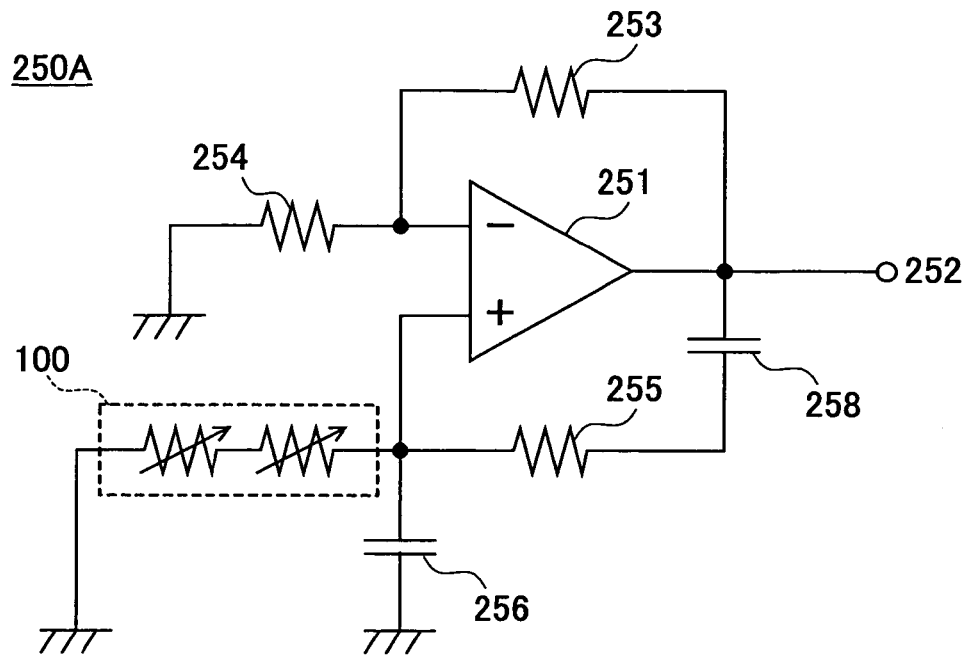
FIGS. 14A and 14B are circuit diagrams illustrating electronic devices according to a ninth embodiment of the present invention
Figure 14B:
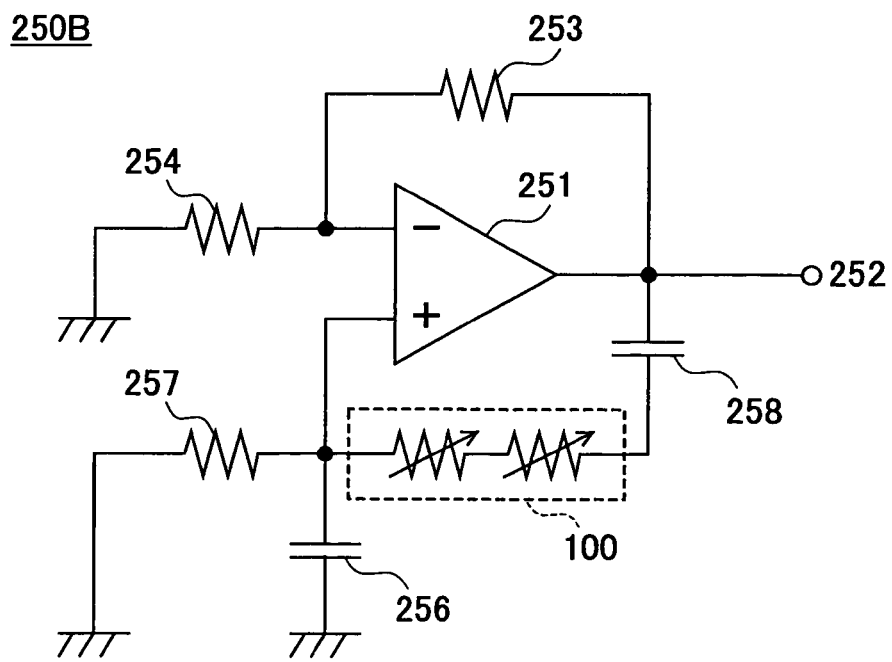

FIGS. 14A and 14B are circuit diagrams illustrating electronic devices 250A and 250B, respectively, each including an oscillation circuit, according to a ninth embodiment. Each of the electronic devices 250A and 250B includes a so-called Wien bridge oscillation circuit.

Referring to FIG. 14A, in the electronic device 250A, the inverting input terminal of an amplifier 251 is connected to ground via a resistor 254, and the inverting input terminal is also connected to an output terminal 252 of the amplifier 251 via a resistor 253.

A resistor 255 and a capacitor 258 are connected in series between the non-inverting input terminal and the output terminal 252 of the amplifier 251. Further, the non-inverting input terminal is connected to ground via a capacitor 256 and is also connected to ground via the semiconductor device 100.

In the electronic device 250A, the resistor 255, the semiconductor device 100, and the capacitors 258 and 256 form a bandpass filter, and form a positive feedback circuit together with the amplifier 251, thereby causing oscillation at a specific frequency. The oscillation frequency at this point is $1/2\pi$ (the capacitance of the capacitor 256 × the capacitance of the capacitor 258 × the resistance of the resistor 255 × the resistance of the semiconductor device 100)$^{1/2}$.

The electronic device 250A can be modified as the electronic device 250B illustrated in FIG. 14B and be used. The electronic device 250B is similar in structure to the electronic device 250A. In the electronic device 250B, the semiconductor device 100 and the resistor 255 in the electronic device 250A are replaced by a resistor 257 and the semiconductor device 100, respectively.

In the electronic devices 250A and 250B illustrated in this embodiment, the semiconductor device 100 is employed. Accordingly, it is possible to control the absolute value and the temperature characteristic of the oscillation frequency with high accuracy while absorbing variations in the components. Further, it is also possible to actively provide the oscillation frequency with a desired temperature gradient.

According to one aspect of the present invention, a resistor having a positive temperature coefficient and high sheet resistance is employed in a resistive element of a semiconductor device. As a result, it is possible to control variations in te resistance and the temperature coefficient of the resistive element, so that a semiconductor device having good operational characteristics can be provided.

The present invention is not limited to the specifically disclosed embodiments, and variations and modifications may be made without departing from the scope of the present invention.

The present application is based on Japanese Priority Patent Application No. 2004-096372, filed on Mar. 29, 2004, the entire contents of which are hereby incorporated by reference.

What is claimed is:

1. A semiconductor device, comprising:
a resistive element, the resistive element comprising:
a first resistive circuit including:
a first plurality of first resistors connected in series, the first resistors each having a positive temperature coefficient;
a second plurality of first resistors, each of the second plurality of first resistors being separately selectively connectable in series with the first plurality of first resistors and each other; and
a second resistive circuit separated from the first resistive circuit by a switching circuit, the second resistive circuit including:
a first plurality of second resistors connected in series, the second resistors each having a negative temperature coefficient;
a second plurality of second resistors, each of the second plurality of second resistors being separately selectively connectable in series with the first plurality of second resistors and each other,
wherein each of the plurality of first resistors includes a metal film, and
wherein the switching circuit is configured to change at least one of a number of resistors of the second plurality of first resistors functioning in the first resistive circuit and a number of resistors of the second plurality of second resistors functioning in the second resistive circuit.

2. The semiconductor device as claimed in claim 1, wherein the metal film is formed of a film including CrSi.

3. The semiconductor device as claimed in claim 1, wherein the second resistor includes polysilicon.

4. The semiconductor device as claimed in claim 1, further comprising:
a connection change part configured to change at least one of a number of resistors of the first plurality of first resistors functioning in the resistive element and a number of resistors of the first plurality of second resistors functioning in the resistive element.

5. The semiconductor device as claimed in claim 4, wherein the connection change part includes first and second interconnection lines each formed to be cuttable, the first interconnection lines being provided for the first plurality of first resistors so as to short-circuit each first resistor, the second interconnection lines being provided for the first plurality of second resistors so as to short-circuit each second resistor.

6. The semiconductor device as claimed in claim 1, further comprising:
a detection part configured to detect an environment of the resistive element.

7. The semiconductor device as claimed in claim 6, further comprising:
a storage part configured to store a signal for causing the connection change part to operate in accordance with a value detected by the detection part.

8. An electronic device, comprising:
a semiconductor device as set forth in claim 1, the semiconductor device being employed as one of:
part of a resistor of a CR oscillation circuit;
a current control resistor of a constant current circuit;
an output voltage detection resistor of a constant voltage circuit; and
a detection resistor of a voltage detector circuit.

9. An electronic device, comprising:
an operational amplifier circuit,
the operational amplifier circuit including a semiconductor device as set forth in claim 1.

10. An electronic device, comprising:
a filter circuit,
the filter circuit including a semiconductor device as set forth in claim 1 and a capacitor.

11. A method of manufacturing a semiconductor device including a resistive element, the resistive element including a first resistive circuit including a first plurality of first resistors connected in series and a second plurality of first resistors being separately selectively connectable in series with the first plurality of first resistors and each other, the first resistors each including a metal film, and a second resistive circuit separated from the first resistive circuit by a switching circuit, the second resistive circuit including a first plurality of second resistors connected in series and a second plurality of second resistors being separately selectively connectable in series with the first plurality of second resistors and each other, the second resistors having a temperature coefficient different from that of the first resistors, the method comprising the steps of:

(a) measuring a resistance of the resistive element by operating the switching circuit to change at least one of a number of resistors of the second plurality of first resistors functioning in the first resistive circuit and a number of resistors of the second plurality of second resistors functioning in the second resistive circuit; and (b) changing, in accordance with the measured resistance, at least one of a number of resistors of the first resistors functioning in the resistive element and a number of resistors of the second resistors functioning in the resistive element.

12. The method as claimed in claim 11, wherein:
the temperature coefficient of the first resistors is a positive temperature coefficient; and
the temperature coefficient of the second resistors is a negative temperature coefficient.

13. The method as claimed in claim 11, wherein the metal film is formed of a film including CrSi.

14. The method as claimed in claim 11, wherein said step (b) includes the step of (c) cuffing off one or more of first and second interconnection lines, the first interconnection lines being provided for the first plurality of first resistors so as to enable each first resistor in the first plurality to be short-circuited, the second interconnection lines being provided for the first plurality of second resistors so as to enable each second resistor in the first plurality to be short-circuited.

15. The method as claimed in claim 11, wherein said step (a) changes a temperature of the resistive element and repeats the measurement of the resistance of the resistive element.

* * * * *